(12) United States Patent
Whipple et al.

(10) Patent No.: US 10,177,515 B2
(45) Date of Patent: Jan. 8, 2019

(54) LUG ASSEMBLIES AND RELATED ELECTRICAL APPARATUS AND METHODS

(71) Applicant: Eaton Intelligent Power Limited, Dublin (IE)

(72) Inventors: Michael Jerome Whipple, Rochester, PA (US); David Wayne Stiffler, Burgettstown, PA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/597,728

(22) Filed: May 17, 2017

(65) Prior Publication Data

US 2018/0337500 A1    Nov. 22, 2018

(51) Int. Cl.
| H02B 1/32 | (2006.01) |
| H01R 27/02 | (2006.01) |
| H01R 31/06 | (2006.01) |
| H01R 4/30 | (2006.01) |
| H01H 71/02 | (2006.01) |
| H01R 9/24 | (2006.01) |

(52) U.S. Cl.
CPC ......... *H01R 27/02* (2013.01); *H01H 71/0207* (2013.01); *H01R 4/30* (2013.01); *H01R 9/2416* (2013.01); *H01R 31/065* (2013.01); *H02B 1/32* (2013.01)

(58) Field of Classification Search
CPC ........ H01R 27/02; H01R 4/30; H01R 9/2416; H01R 31/065; H01H 71/0207; H02B 1/32
USPC ....................................................... 361/659
See application file for complete search history.

(56) References Cited

U.S. PATENT DOCUMENTS

| 3,518,599 | A | * | 6/1970 | Lanux | .................. | H01H 85/545 |
| | | | | | | 337/186 |
| 4,024,441 | A | | 5/1977 | Coyle et al. | | |
| 6,018,452 | A | * | 1/2000 | Meyerhoefer | ............ | H01T 4/06 |
| | | | | | | 361/111 |
| 6,194,983 | B1 | | 2/2001 | Bogdon et al. | | |
| 6,227,913 | B1 | * | 5/2001 | Davis | ....................... | H02B 1/18 |
| | | | | | | 439/620.26 |
| 7,186,933 | B2 | | 3/2007 | Turner | | |
| 7,983,024 | B2 | * | 7/2011 | Harris, IV | ........... | H01H 85/046 |
| | | | | | | 29/829 |
| 8,686,596 | B2 | * | 4/2014 | Huss | ..................... | H01H 85/32 |
| | | | | | | 307/117 |
| 9,299,523 | B1 | | 3/2016 | Whipple et al. | | |
| 2005/0200206 | A1 | * | 9/2005 | Hussaini | ............... | H02J 7/0042 |
| | | | | | | 307/150 |
| 2005/0284739 | A1 | * | 12/2005 | Rowe | ................... | H01H 1/5855 |
| | | | | | | 200/293 |

(Continued)

FOREIGN PATENT DOCUMENTS

| JP | 08078076 | A | * | 3/1996 |
| KR | 741550 | B1 | * | 7/2007 |

*Primary Examiner* — Anatoly Vortman
(74) *Attorney, Agent, or Firm* — Myers Bigel, P.A.

(57) ABSTRACT

Lug assemblies include a housing with at least one internal printed circuit board with electronics and lugs. The lugs attach to cables providing power/current. The printed circuit board includes at least one electrical ground connector and at least one electrical contact connector. The lug assemblies include terminals that indirectly electrically couple the cables to terminals of switching devices such as circuit breakers.

22 Claims, 17 Drawing Sheets

(56) References Cited

U.S. PATENT DOCUMENTS

2013/0077210 A1  3/2013 Morris
2014/0041891 A1* 2/2014 Kim .................. H05K 5/06
                                           174/50.5

* cited by examiner

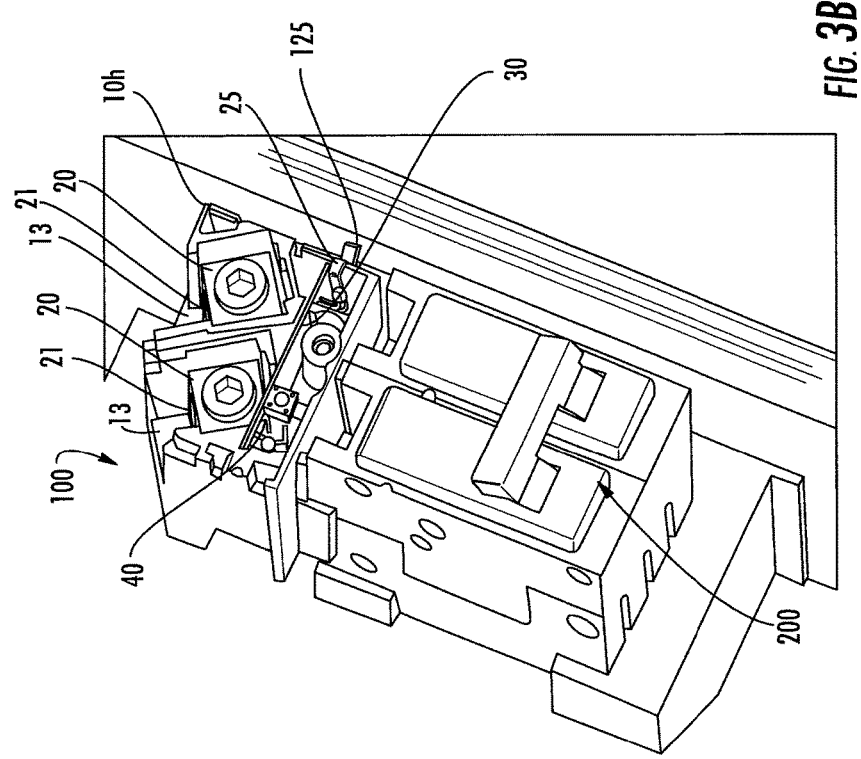
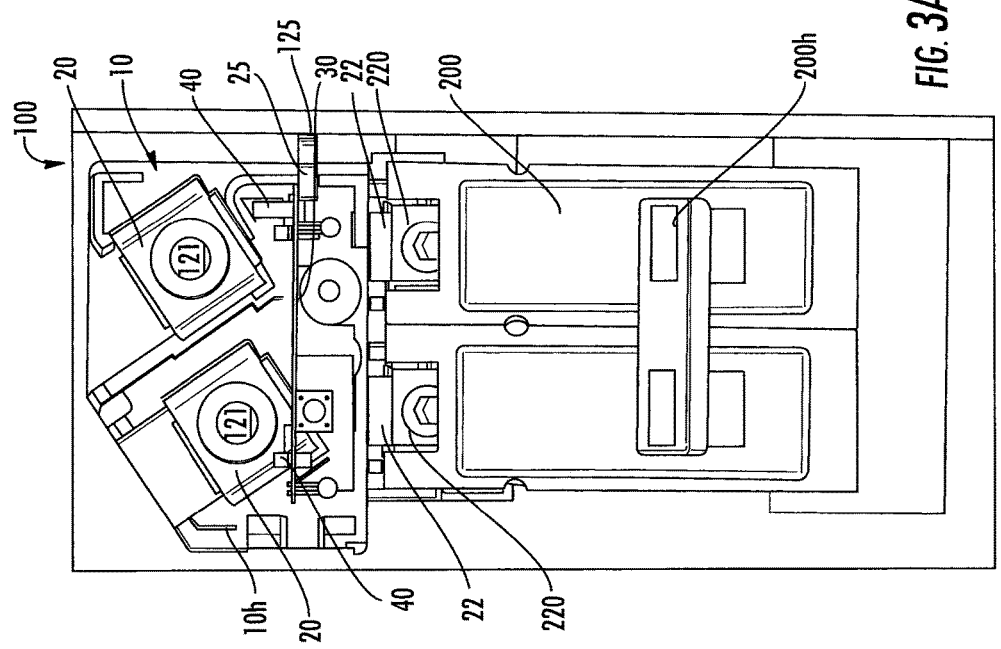

LUG ASSEMBLIES AND RELATED ELECTRICAL APPARATUS AND METHODS

FIELD OF THE INVENTION

The present disclosure relates to lug assemblies for electrical distribution apparatus with switching devices such as meter stacks and/or distribution load centers.

BACKGROUND OF THE INVENTION

Electrical meter stacks and load centers are well known and include electrical busses comprising conductors permitting electrical current to be carried. Electrical busses may contain features permitting attachment of fuses, relays, switches, wires, breakers, and other electrical elements.

Lug assemblies allowing cables to be indirectly connected to terminals of circuit breakers to accommodate larger diameter cables without requiring pin connectors are described in U.S. Pat. No. 9,299,523, the content of which is hereby incorporated by reference as if recited in full herein.

SUMMARY OF EMBODIMENTS OF THE INVENTION

Embodiments of the present invention provide lug assemblies with a housing comprising at least one printed circuit board with electronics for providing desired functionality for different uses such as tenant side metering, alarms, current conduction status monitoring, safety light indicators and the like.

Embodiments of the invention are directed to a lug assembly for a switching device of an electrical distribution apparatus. The lug assembly includes: a housing having an interior compartment and an outer wall, the outer wall comprising at least one cable channel; at least one lug held in the interior compartment of the housing adapted to attach to a power cable, the lug having an open channel aligned with the cable channel in the outer wall of the housing; a printed circuit board held in the housing; at least one ground connector coupled to the printed circuit board; and at least one contact connector coupled to the printed circuit board, spaced apart from the at least one electrical ground.

The at least one lug can be a plurality of spaced apart lugs with axially extending centerlines aligned with a fastener that extends therein and that can reside a distance between 1-2 inches from a primary surface of the printed circuit board.

A top edge of the printed circuit board can be coupled to an inner surface of the cover. The printed circuit board can be orthogonal to a primary body of the cover.

The lug assembly can have at least one terminal that extends out of the housing in an outer wall of the housing spaced apart from the outer wall comprising the cable channels. The at least one ground connector can include a ground connector that extends a distance laterally outside a perimeter of the printed circuit board. The at least one contact connector can extend a distance outside a perimeter of the printed circuit board.

The at least one ground connector can be curvilinear and can have a free end that can flex inwardly. The at least one ground connector can extend a distance outside an outer wall of the housing.

The at least one lug can include first and second lugs. The printed circuit board can have a perimeter having a width dimension and a height dimension. The perimeter can include opposing sides across the width dimension with one side being shorter and the other side being longer than the other in the height dimension. The at least one ground connector can be or includes a curvilinear ground connector that extends laterally outward from an outer facing end portion of the longer side. The at least one contact connector can include a first contact connector and a second contact connector that are curvilinear and spaced apart from the ground connector. The first contact connector can extend outward from an inner facing end portion of the longer side of the printed circuit board to couple to a terminal of the first lug. The second contact connector can extend off an inner facing end portion of the shorter side of the printed circuit board to couple to the second lug.

The at least one lug can include first and second lugs. The at least one contact connector can include first and second contact connectors. The first lug can be coupled to the first contact connector and the second lug can be coupled to the second contact connector.

The lug assembly can also include at least one fastener that is orthogonal to the primary body of the cover and that can extend into a receiving member in the housing. The printed circuit board can include electrical components that reside off a first primary surface of the printed circuit board and that reside in contoured cavities of the housing. The cover can have cylindrical cavities that receive circular fasteners attached to a top of the lugs. The cover, when assembled, can apply an inwardly extending force against the printed circuit board to thereby provide positive engagement contacts with ground and current carrying members at installation.

The cover can have a primary body with an inner surface that secures a top edge of the printed circuit board. The printed circuit board can be a first printed circuit board with a perimeter shape and with a circuit with electronic components. The circuit can be adapted to monitor current from a power source delivered from at least one power cable to the switching device. The lug assembly can be configured to serially and interchangeable accept a second printed circuit board with a different circuit and the same perimeter shape to thereby allow a lug assembly to provide changeable and different monitoring and alert functionality.

The printed circuit board can have a circuit with one or more inductor, capacitor, resistor, transceiver, digital signal processor, or onboard battery.

The printed circuit board can have a circuit that couples to the at least one contact and may monitor power usage at the switching device and/or transmit signals associated with power usage measurements and/or power outage alarms to remote devices.

The printed circuit board can have a conduction monitoring circuit with at least one light emitting diode (LED) that is visually accessible through the cover. The LED can illuminate when there is conduction to the switching device.

The printed circuit board can have a circuit with a transceiver that wirelessly communicates with one or more local or remote devices.

The printed circuit board can have a circuit that is coupled to the at least one lug though the at least one contact connector to monitor tenant side power usage in a meter stack.

Other embodiments are directed to an electrical distribution apparatus. The apparatus includes an enclosure and a lug assembly in the enclosure. The lug assembly can include: a housing having an interior compartment and an outer wall, the outer wall comprising at least one cable channel; at least one lug held in the interior compartment of the housing; a printed circuit board held in the housing; at least one ground connector attached to the printed circuit board and electrically coupled to the enclosure; at least one contact connector attached to the printed circuit board and coupled to the at least one lug; and at least one terminal coupled to the at least one lug and extending out of the housing. The apparatus can also include at least one power cable attached to a corresponding one lug of the at least one lug in the housing of the lug assembly and a switching device coupled to the at least one terminal extending out of the housing of the lug assembly. The at least one terminal of the lug assembly provides an electrical path for current from the power cable to the electrical switching device.

The apparatus can also include first and second lugs as the at least one lug, first and second contact connectors as the at least one contact connector, and first and second power cables as the at least one power cable. The first power cable can couple to the first lug and the second power cable can couple to the second lug. The first contact connector can couple to the first lug and the second contact connector can couple to the second lug.

The at least one terminal of the lug assembly can include or be first and second terminals. The switching device can have a circuit breaker and first and second circuit breaker lugs each having an open through channel that couple to the first and second lugs of the lug assembly to provide electrical current pathways. The at least one lug of the lug assembly can include first and second spaced apart lugs with axially extending centerlines aligned with a fastener that extends therein that can reside a distance between 1-2 inches from a primary surface of the printed circuit board.

The printed circuit board can be orthogonal to a primary body of the cover.

The at least one ground connector can include a ground connector that is curvilinear and can extend a distance laterally outside a perimeter of the printed circuit board and outside a wall of the housing. The at least one contact connector can be curvilinear and can extend a distance outside a perimeter of the printed circuit board.

The printed circuit board can be a first printed circuit board with a perimeter shape and comprising a circuit with electronic components. The circuit can be adapted to monitor current from a power source delivered from at least one power cable to the switching device. The lug assembly can be configured to serially and interchangeable accept a second printed circuit board with a different circuit and the same perimeter shape to thereby allow a lug assembly to provide changeable and different monitoring and alert functionality.

The printed circuit board can have a circuit with one or more of an inductor, capacitor, resistor, transceiver, digital signal processor, or battery.

The printed circuit board can have a circuit that couples to the at least one contact and monitors power usage at the switching device. The circuit can include a wireless transceiver that sends power usage measurements and/or power outage alarms to remote devices.

The printed circuit board can have a conduction monitoring circuit with at least one light emitting diode (LED) that is visually accessible through the cover. The LED can illuminate when there is conduction to the switching device.

The printed circuit board can have a perimeter having a width dimension and a height dimension. The perimeter can have opposing sides across the width dimension with one side being shorter and the other side being longer than the other in the height dimension. The at least one ground connector can be or include a curvilinear ground connector that extends laterally outward from an outer facing end portion of the longer side. The at least one contact connector can include a first contact connector and a second contact connector that can be curvilinear and are spaced apart from the ground connector. The at least one lug can have first and second lugs and the first contact connector can extend outward from an inner facing end portion of the longer side to couple to a terminal coupled to the first lug. The second contact connector can extend off an inner facing end portion of the shorter side of the printed circuit board to couple to the second lug.

Yet other embodiments are directed to methods of monitoring current from a power source to an electrical switching device. The methods include monitoring current from a power source to an electrical switching device using a circuit on a printed circuit board in a housing of a lug assembly that is attached to at least one power cable and that resides adjacent the switching device in an electrical distribution apparatus.

The method can also include obtaining current measurements based on the monitored current and electronically sending the current measurements to a local and/or remote device.

The method can further include illuminating a light coupled to the circuit on the printed circuit board when there is electrical conduction to the switching device thereby allowing a user to visually identify a conduction status of the switching device The method can also include electronically transmitting a power outage alert based on the current monitored by the circuit on the printed circuit board.

The printed circuit board can have a ground connector that engages sheet metal of the enclosure of the electrical distribution apparatus and the circuit. The printed circuit board can include at least one electrical contact that is electrically coupled to a current carrying member of the lug assembly and the circuit for monitoring the current.

The printed circuit board can be held orthogonal to and under a primary body of a cover attached to the lug assembly housing.

Still other embodiments are directed to methods of servicing an electrical distribution apparatus comprising an enclosure with at least one switching device and at least one lug assembly. The methods include: (a) loosening or removing a fastener extending through a cover of a lug assembly from a lug assembly housing holding at least one printed circuit board as installed in the electrical distribution apparatus, optionally a meter stack or loadcenter; (b) pulling the printed circuit board out of the lug assembly housing to concurrently disengage contact connectors and a ground contact connector in response to the pulling; (c) inserting a different printed circuit board into the housing; and (d) tightening the fastener against the cover and housing to cause ground and contact connectors of the printed circuit board to couple respectively to a ground in the enclosure and to current carrying members in the lug assembly housing.

The loosening or removing can be carried out to loosen instead of removing, and then pivoting the cover to expose the printed circuit board in the housing.

The method can further comprise providing a light from an electrical component on or in communication with the printed circuit board that is visually identifiable through or on the cover before loosening or removing whereby the light, if on, identifies a conduction status of the switching device in the electrical distribution apparatus, optionally a meter stack or loadcenter.

The different printed circuit board can have the same perimeter shape and different electronic circuitry than the removed printed circuit board. The original and the different printed circuit board can be held orthogonal to and under a primary body of the cover.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 3A is a top view of the lug assembly shown in FIG. 2A, shown without the cables attached.

FIG. 3B is a top, side perspective view of the lug assembly shown in FIG. 3A.

DETAILED DESCRIPTION OF EMBODIMENTS OF THE INVENTION

Figure 1:
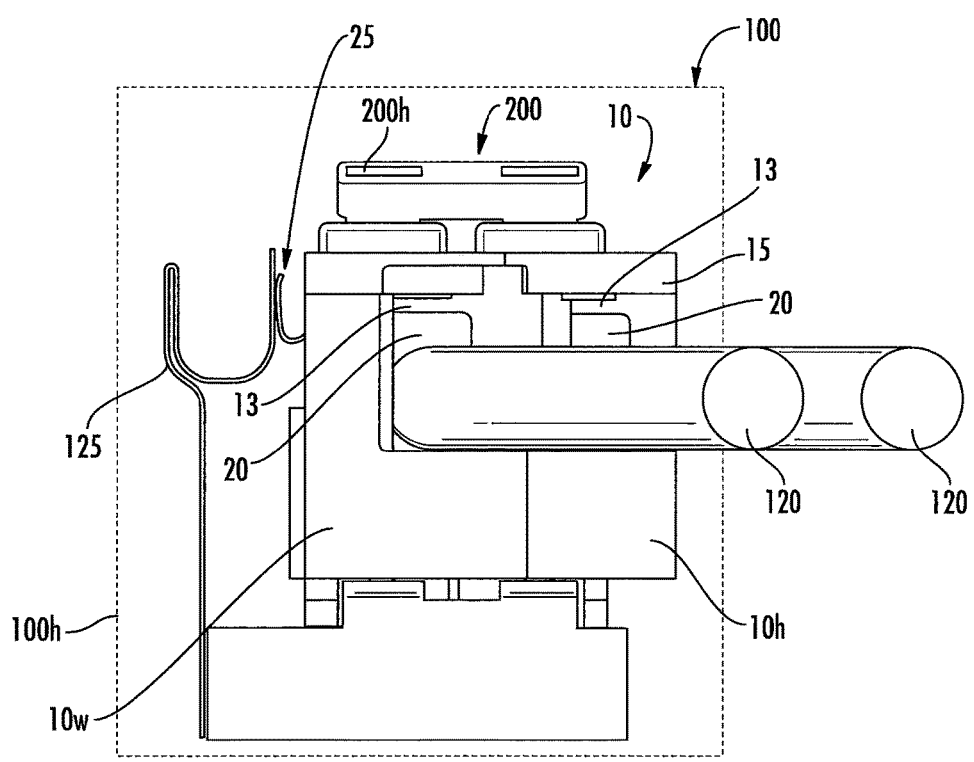
FIG. 1 is a top view of a lug assembly for an electrical apparatus according to embodiments of the present invention.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'"). The terms "Fig." and "FIG." may be used interchangeably with the word "Figure" as abbreviations thereof in the specification and drawings. In the figures, certain layers, components or features may be exaggerated for clarity, and broken lines illustrate optional features or operations unless specified otherwise.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention are particularly suitable for electrical devices such as, but not limited to, devices with electrical switching systems such as residential or commercial meter enclosures (i.e., meter stacks) and load centers. The terms "meter stack" and "load center" and refer to the collective components of an electrical distribution system and its respective housing that supplies electrical power to one or more subsidiary circuits that include switching devices such as one or more circuit breakers. The terms "bus," "bus element," "electrical distribution bus," or "bus bar" refers to components in an electrical distribution system that conducts electricity within the meter stack, load center or other electrical apparatus.

Figure 2A:
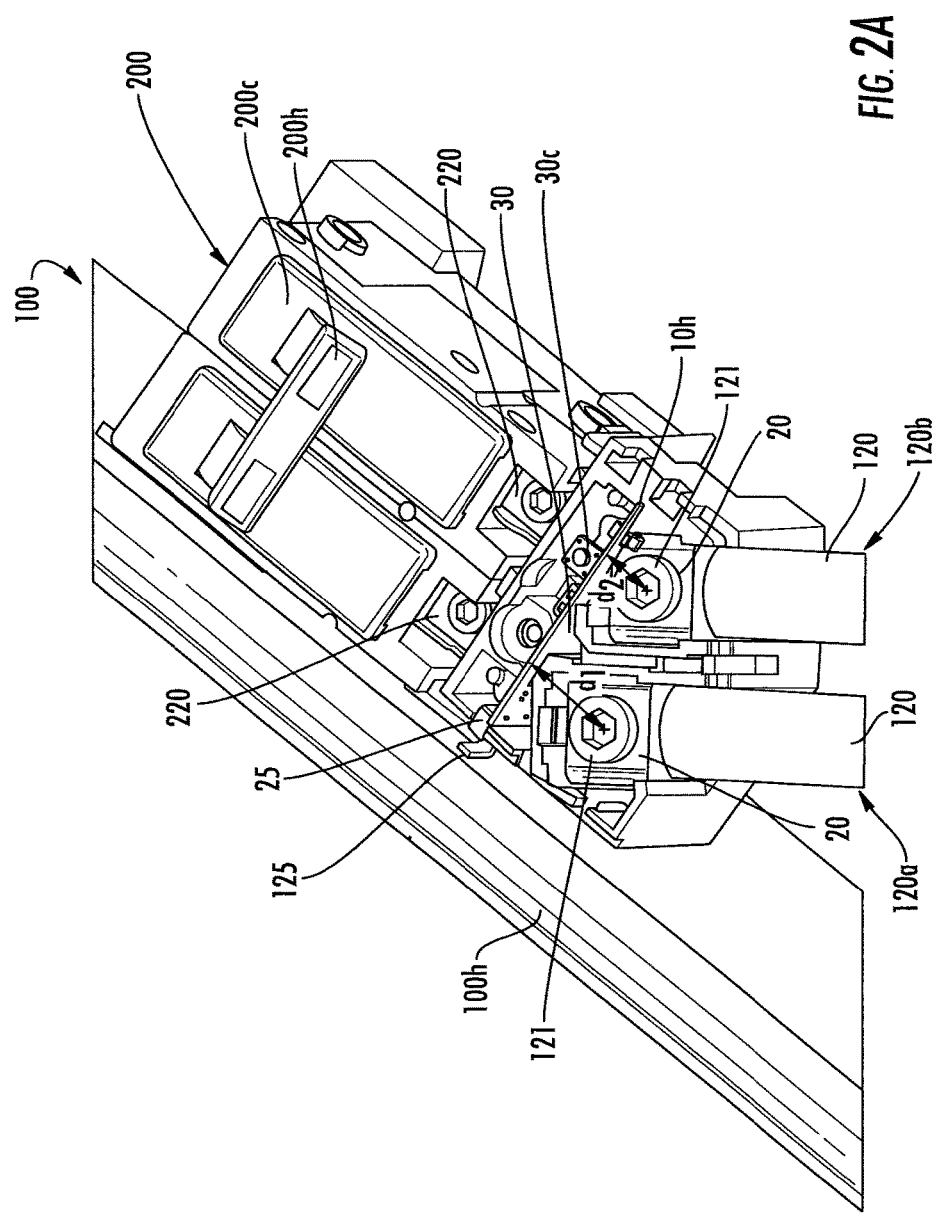
FIG. 2A is a top, side perspective view of the lug assembly shown in FIG. 1, shown without the cover of the lug assembly housing according to embodiments of the present invention.
Figure 4:
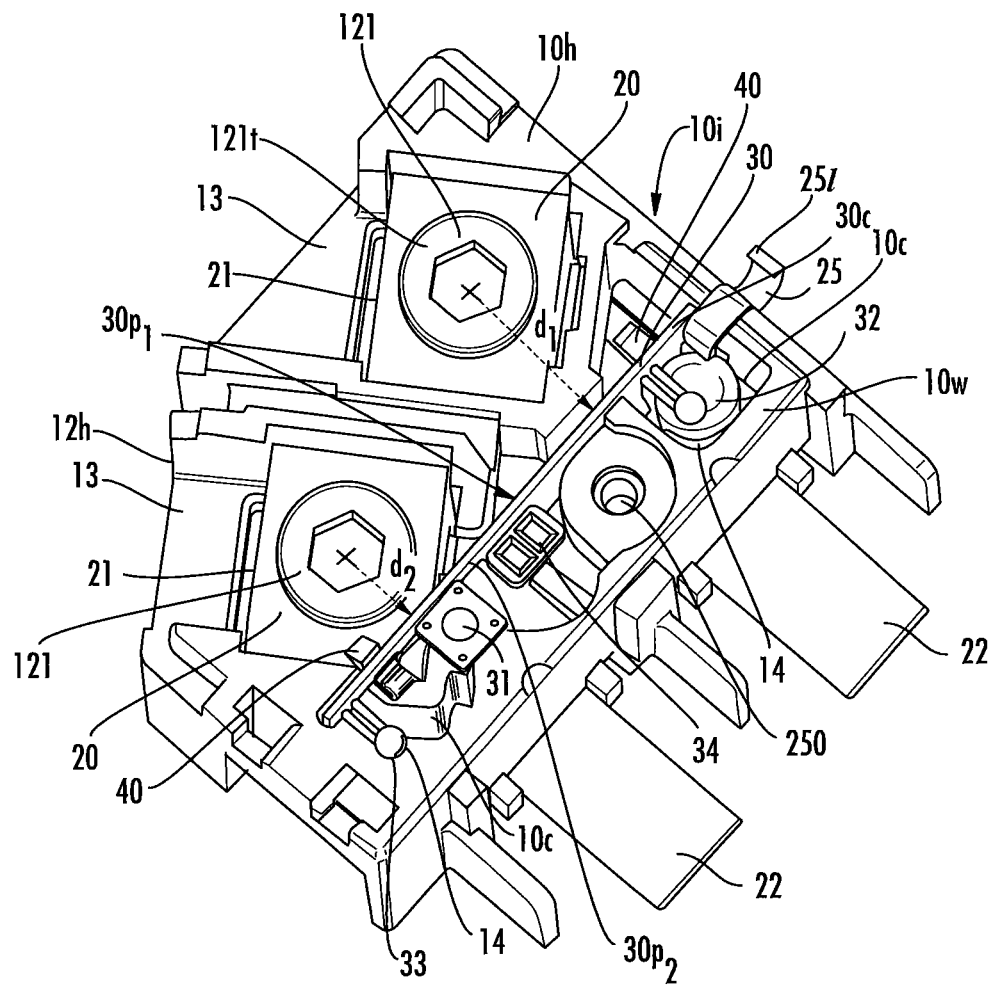
FIG. 4 is an enlarged top perspective view of the lug assembly, shown without the cover attached to the housing and with terminals from the switching device(s) coupled to the lug assembly, according to embodiments of the present invention.
Figure 5:
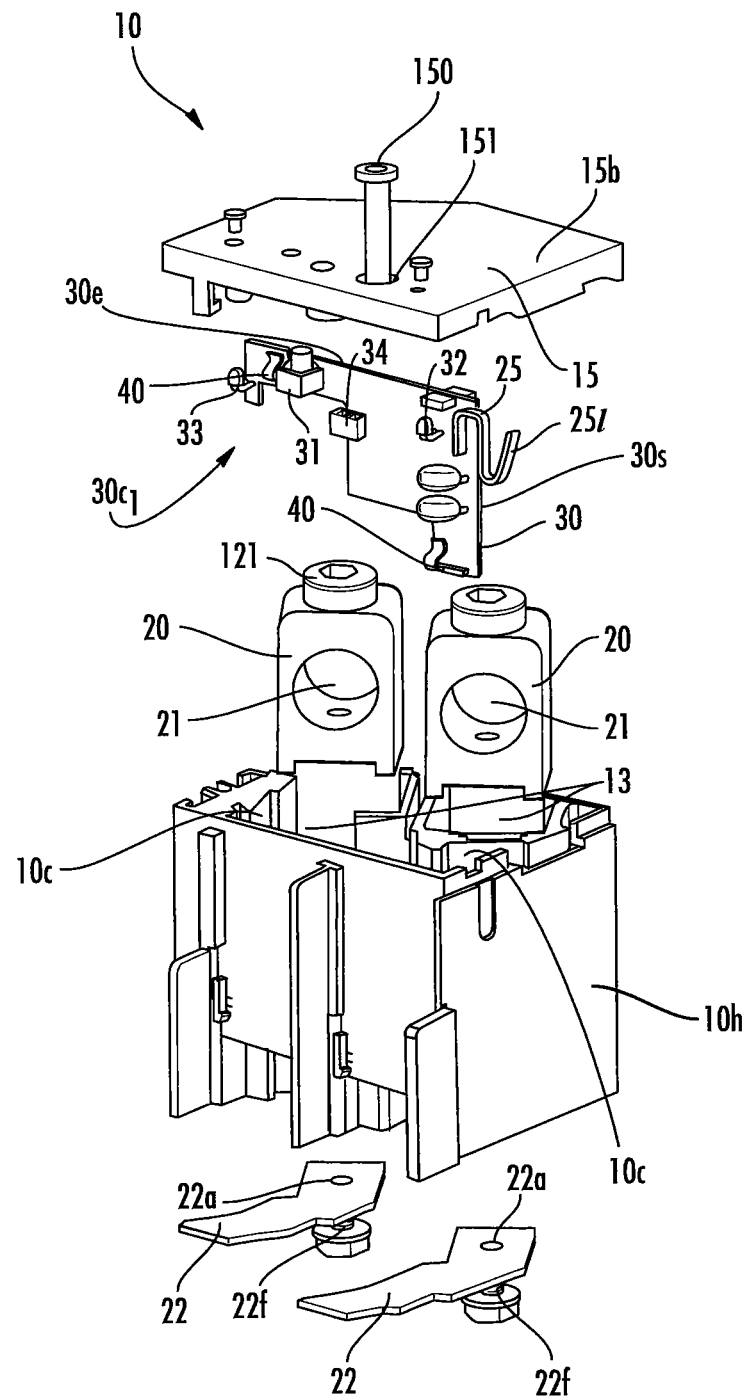
FIG. 5 is an exploded view of a lug assembly according to embodiments of the present invention.

Referring now to FIG. 1 and FIG. 2A, an exemplary electrical apparatus 100 with an enclosure 100h and at least one lug assembly 10 is shown. The lug assembly 10 includes a cover 15 and a housing 10h. The lug assembly 10 also includes at least one lug 20 that can be coupled to a cable 120 that is electrically coupled to a switching device 200 in the enclosure 100h of the electrical apparatus. The cable 120 can provide power from a utility (power grid) or other power source. The housing 10 can have an outer wall 10w with cable channels 13 that allow the cables to extend out from the housing 10. The cable channels 13 can have any suitable shape, shown as rectangular in FIG. 1. As is well known, each lug 20 can have an open cable channel 21 (FIG. 5) that can cooperate with a fastener 121 to secure an end of the cable 120 in the lug 20. The open cable channel 21 is aligned with the housing channel 13 (FIGS. 3B, 4 and 5).

The lug assembly 10 can include at least one ground connector 25 that electrically couples to a grounded sheet metal 125 in or on the enclosure 100h. The ground connector 25 can include a leg 25l that can flex inwardly toward a side edge of the printed circuit board 30 in response to contact with the enclosure 100h to provide electrical contact with the enclosure 100h upon proper installation of the lug assembly 10 in the enclosure 100h without requiring any soldering or mechanical fastening.

As shown in FIG. 2A, the lug assembly 10 includes first and second lugs 20 for first and second cables 120, respectively. The cables 120 can be a phase A cable 120a and a phase B cable 120b as electrical inputs to the switching device 200.

The switching device 200 can, in some embodiments, be a two pole or tandem circuit breaker 200. The lug assembly 10 can be configured to occupy (e.g., have) a width of a single or a double pole breaker. As is well known to one of skill in the art, a single-pole breaker takes one slot in a circuit breaker panel and tandem breaker takes one slot space but has two separate single-pole breakers in that one space. A double pole breaker takes two slots in the circuit breaker panel.

Thus, while the lug assembly 10 is shown for use with a double pole breaker 200 it may be configured for use with a single lug 20 for a single cable 120. The lug assembly 10 may alternatively be configured with more than two lugs 20, such as for a three or four pole circuit breaker.

In some particular embodiments, the switching device 200 can be a two or three phase circuit breaker 200c attached to two or three cables 120.

Figure 2B:
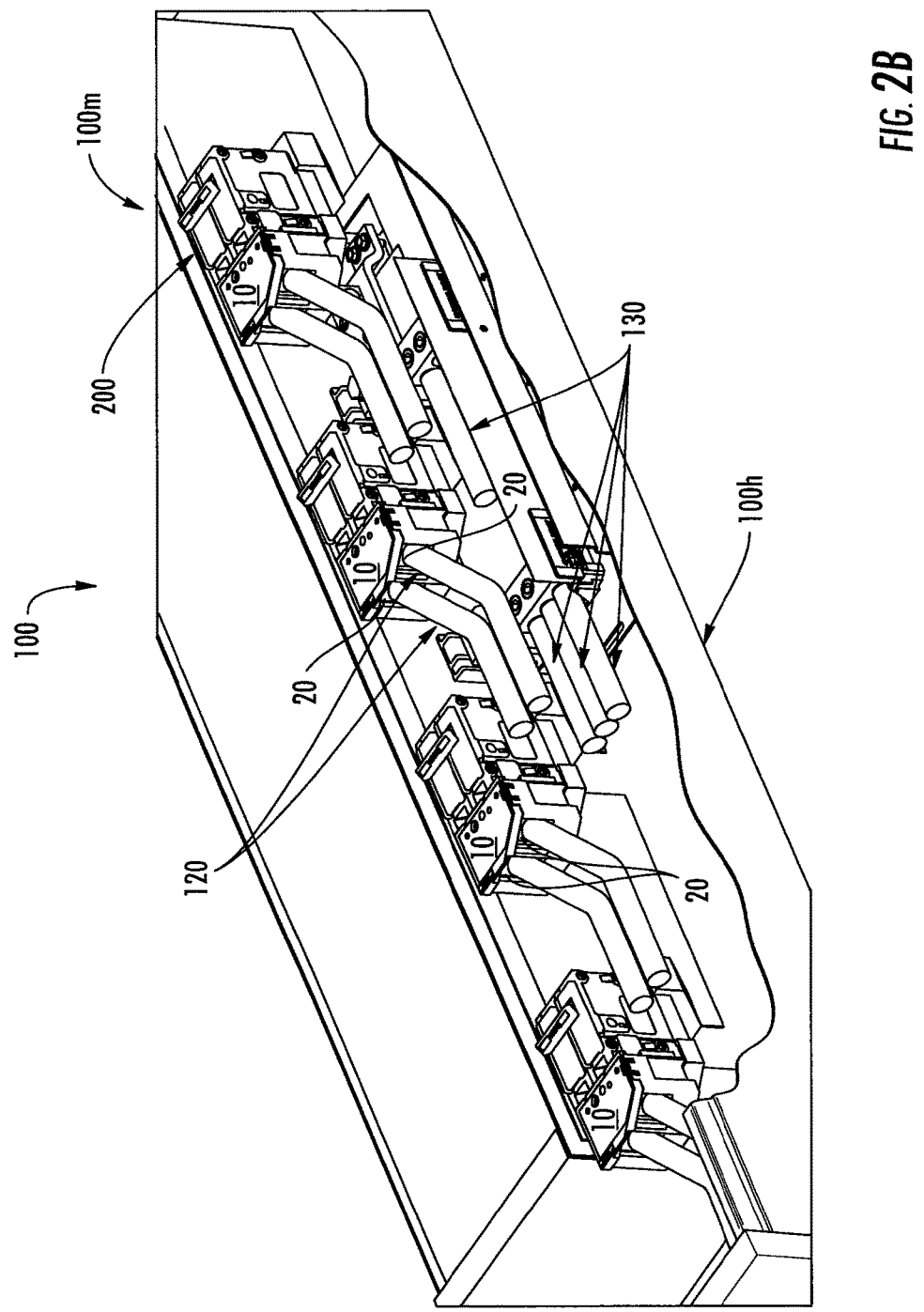
FIG. 2B is a partial cutaway, side perspective view of a meter stack with a plurality of the lug assemblies shown in FIG. 2A according to embodiments of the present invention.

FIG. 2B illustrates an electrical power distribution apparatus 100 comprising a housing enclosing a meter stack 100m with tenant main breakers 200 and respective lug assemblies 10 (i.e., lug kits) that may or may not comprise electronics held by a printed circuit board 30. That is, one or more lug assembly 10 can include the printed circuit board 30 and one or more may not have the printed circuit board 30. Different lug assemblies 10 in the meter stack 100m can have different electronics provided by the respective printed circuit board 30. The enclosure housing 100h also holds neutral cables 130 to sub-feed panels along with the power phase cables 120 to sub-feed panels as is known to those of skill in the art.

As shown in FIG. 3A, the switching device 200 can have at least one handle 200h that may be used to turn off electrical conduction. The switching device 200 can also include lugs 220 that engage switch assembly terminals 22. The switching device 200 can include lugs 220 that electrically engage one of the cables 120 held by the lugs 20 of the lug assembly 10.

Although shown in FIGS. 3A and 3B as above the switching device 200, the lug assembly 10 may be placed below the switching device 200 and the one or more cables 120 directed upward instead of downward.

Referring to FIGS. 2, 3A, 3B and 4, the lug assembly 10 includes at least one printed circuit board 30 with circuitry 30c (with respect to the printed circuit board 30, the term "circuitry" is used interchangeably herein with "circuit") held in the housing 10h under the cover 15 (which is omitted in these views). The housing 10h and cover 15 can be an injection molded thermoplastic or other polymeric material and can be non-conductive (electrically insulating).

The at least one printed circuit board 30 can include at least one electrical current contact connection 40, shown as two, one for each cable 120. The at least one printed circuit board 30 can be oriented perpendicular to the primary body 15b of the cover 15. The printed circuit board 30 can extend across the housing 10h in a width dimension closer to the switching device 200 than the cables 120, with one laterally extending side (width direction) of the printed circuit board 30 closer to a lug 20 than the other next to the other lug 20.

The footprint in an electrical enclosure 100h adjacent the switching device 200 can be relatively compact and positioning projecting electronics of the circuitry 30c relatively close to power cables 120 and terminals 22, for example, can be challenging. As shown in FIG. 2 and FIG. 4, for example, a center of a first lug 20 (aligned with an axially extending centerline of a fastener 121) can reside a distance $d_1$ from the printed circuit board 30 and a center (also aligned with an axially extending centerline of a fastener 121) of the second lug 20 can reside a distance $d_2$ from the printed circuit board 30 and, as shown, $d_1 > d_2$. The actual value of either $d_1$ and/or $d_2$ is based on a geometry of the apparatus (lug kit) and the available space in which to fit a respective printed circuit board 30 containing various electronic components and electrical connectors. The distances can be whatever it takes to create an interface between the printed circuit board 30 and the two (2) phases of the electrical circuit.

As for the distance between the lugs 20 and the fasteners 121 of each phase, the primary requirement is that the electrical clearance be maintained between terminals of opposite polarity and between terminals and any grounded metal per UL 489. Those required, minimum distances are based on the voltage of the device. In the case of one embodiment of a lug kit, this can be 120V per phase or a maximum potential voltage of 240V and the below minimum spacing.

Minimum Spacing for the Lugs:

| TERMINALS OF OPPOSITE POLARITY | | TERMINALS AND GROUNDED METAL | |
| --- | --- | --- | --- |
| Thru Air | Over Surface | Thru Air | Over Surface |
| 3/4 inch | 1 1/4 inch | 1/2 inch | 1/2 inch |

Referring to FIG. 4 and FIG. 5, for example, the printed circuit board 30 can include opposing planar primary surfaces $30p_1$, $30p_2$. The circuitry 30c can include electronic components 31-34 that are supported by the primary surface $30p_2$ that faces the switching device 200. The other primary surface $30p_1$ can be devoid of electronic components so that it is flat and resides closer to the lugs 20. However, the printed circuit board 30 may provide electronic components only on the other primary surface $30p_1$ or on both primary surfaces $30p_1$, $30p_2$.

Referring again to FIG. 4, the housing 10h can have an interior compartment 10i with shaped or contoured geometric wall features that accommodate the electronic components 31-34 and the printed circuit board 30. One or more of the wall features can include curved or arcuate segments 14 corresponding to a curvature of the components held thereat, i.e., 32, 33, for example.

The electronic components 31-34 can include, by way of example, one or more inductors, capacitors, resistors, transceivers, digital signal processors, onboard batteries and/or other circuit components that provide desired operational function such as metering, alarms, conduction status monitoring with safety light indicators and the like. The circuitry 30c can wirelessly communicate with remote devices such as whole house (i.e., residence or commercial spaces) control systems, smartphones, utility company computers, resident management computers and the like. The circuit 30c can include a "wireless module" such as a microchip package, that has an onboard wireless transceiver with a processor and a plurality of general input and output ports and may operate in a WiFi or LTE frequency band, although other frequency bands may be used.

For example, for a multi-tenant residence or commercial space, the enclosure can include a different lug assembly 10 for each unit or specific tenant space providing tenant specific and tenant side information by lug assemblies 10 in the enclosure. This can include, by way of example only, using lug assembly electronics 30c to identify and provide information regarding an increase or decrease in power consumption, which may be related as a message to owners, renters, lessees, power or resident management services, identifying and sending a power outage notification or alert to one or more users related to accounts associated with respective lug assemblies 10 (and/or switching devices 200).

The lug assemblies 10 can accommodate different circuit boards 30 with different circuits 30c and/or electronic components 31-34, for example. The lug assemblies 10 can be configured for retrofit use in existing loadcenters and/or meter stacks or other electrical distribution apparatus, for example. Once installed, different printed circuit boards 30 can be interchanged with currently installed printed circuit boards 30 to change out functionality or upgrade or repair respective lug assemblies 10. The different circuit boards 30, 30' (FIGS. 5, 6, for example) can have the same perimeter shape and the same electrical and ground connectors 25, 40.

As also shown in FIGS. 4 and 5, for example, the ground connector 25 can have a curvilinear shape that provides the leg 25l and the leg can extend outward a distance from a side 30s of the printed circuit board 30, typically between the primary surface $30p_2$ and the cover 15. The leg 25l can reside outside the housing 10h. Although shown as extending over an outer surface of the housing 10h under the cover 15, the ground connector 25 can have other configurations and locations and may, for example, be configured to extend out an aperture in the sidewall of the housing.

FIG. 5 also illustrates a fastener 150 that extends through an aperture 151 toward the housing 10h into a receiving segment 250 of the housing 10h (FIG. 4) that can be used to tighten the cover 15 against the housing 10h and, in turn, apply a force or pressure against a top or outer facing edge 30e of the printed circuit board 30 to create a positive physical contact between the connectors 40 and electrically couple with current carrying members of the lug assembly 10.

Figure 6A:
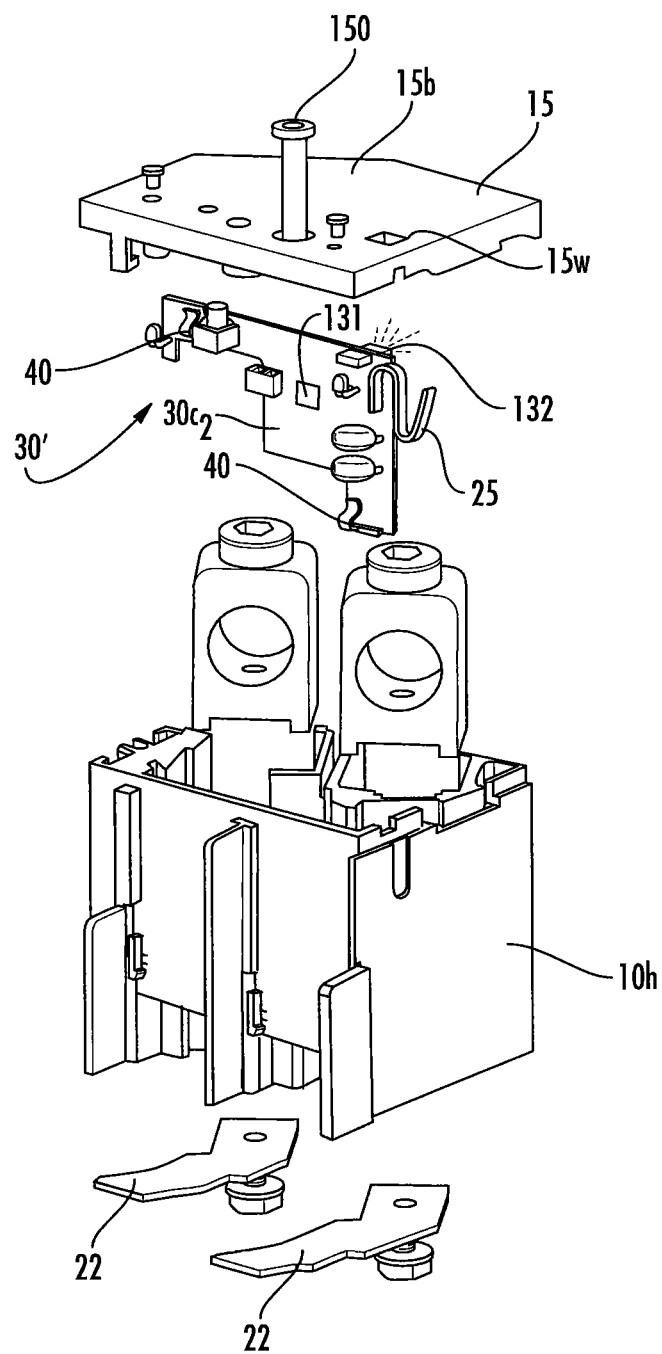
FIG. 6A is an exploded view of another embodiment of a lug assembly according to embodiments of the present invention.

FIG. 6A illustrates another example of a lug assembly 10, with a different printed circuit board 30'. This printed circuit board 30' can have the same perimeter (i.e., "footprint") and can be interchangeably used instead of the printed circuit board 30 shown in FIG. 5, for example. The printed circuit board 30' has different electronic circuitry $30c_2$ with different functionality from the circuitry 30c of the first printed circuit board 30. Also, the printed circuit board 30' can include a conduction status monitoring circuit 131 that electrically monitors for current being conducted to the switching device 200. As shown, the conduction status circuit 131 can be coupled to one or more light emitting diodes (LED) 132 that can be illuminated and externally visually accessed to indicate conduction status, such as when conduction to the switching device 200 is ON (even if a handle 200h indicates a tripped condition for an additional level of safety).

The cover 15 can have a primary body 15b that is perpendicular to the printed circuit board. The cover 15 can include a window 15w which can be an open space or a translucent or transparent segment over the LED 132 that allows a user to visually assess whether conduction is ON or OFF without removing the cover 15 based on whether light is illuminated from the LED 132. Rather than merely showing illumination (i.e., light on or off), different color LEDs may be used to provide the visual conduction or non-conduction status of the switching device 200. The LED(s) 132 can be directly visible through the cover 15 by positioning the LED in a direct optical path or light guides may be used. The light source 132 can also be positioned to extend through the window or reside on an outer surface of the cover.

Figure 6B:
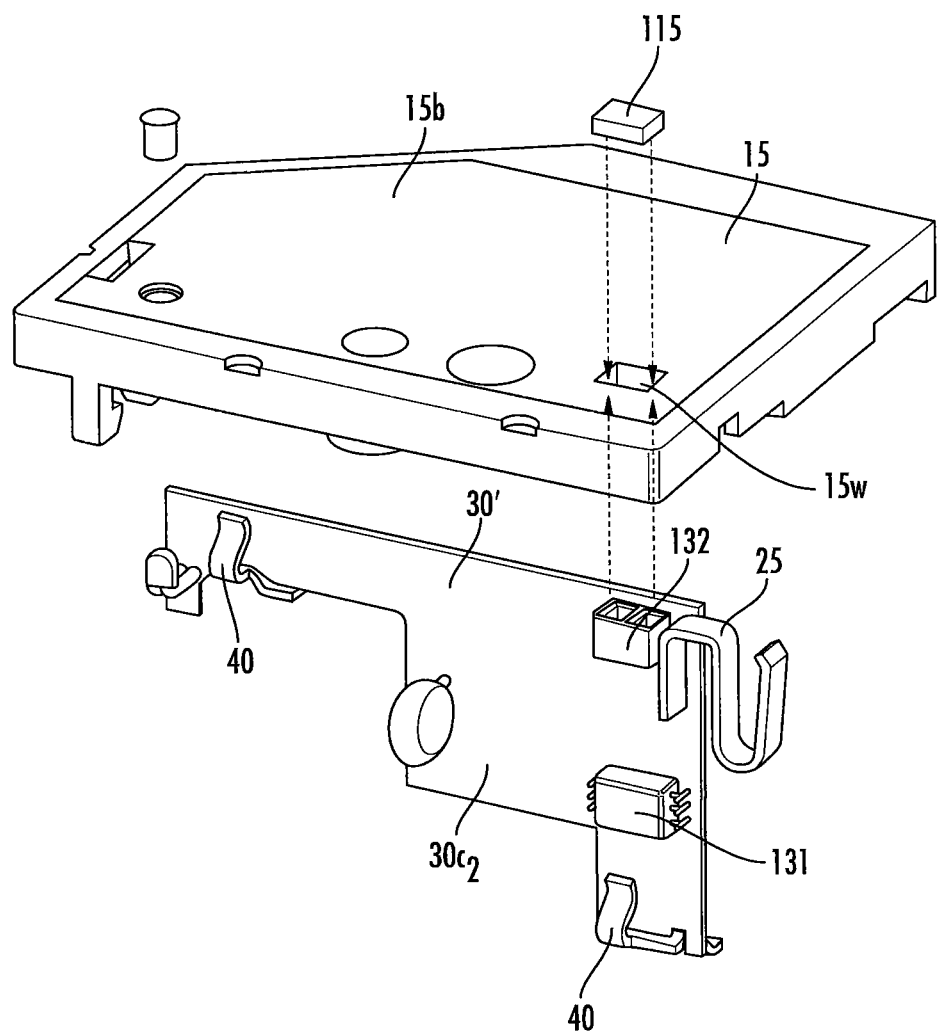
FIG. 6B is an enlarged side perspective view of components of another embodiment of the lug assembly according to embodiments of the present invention.

FIG. 6B illustrates that the cover 15 can hold a visually transmissive lens 115, i.e., a translucent, transparent or clear lens that can be held by the window 15w of the cover 15. As shown, the conduction status circuit 131 can be coupled to one or more light emitting diodes (LED) 132 or other component that can be illuminated and externally visually accessed at the lens 115 to indicate conduction status, such as when conduction to the switching device 200 is ON (even if a handle 200h indicates a tripped condition for an additional level of safety) without removing the cover 15 from the lug kit 10.

Figure 7:
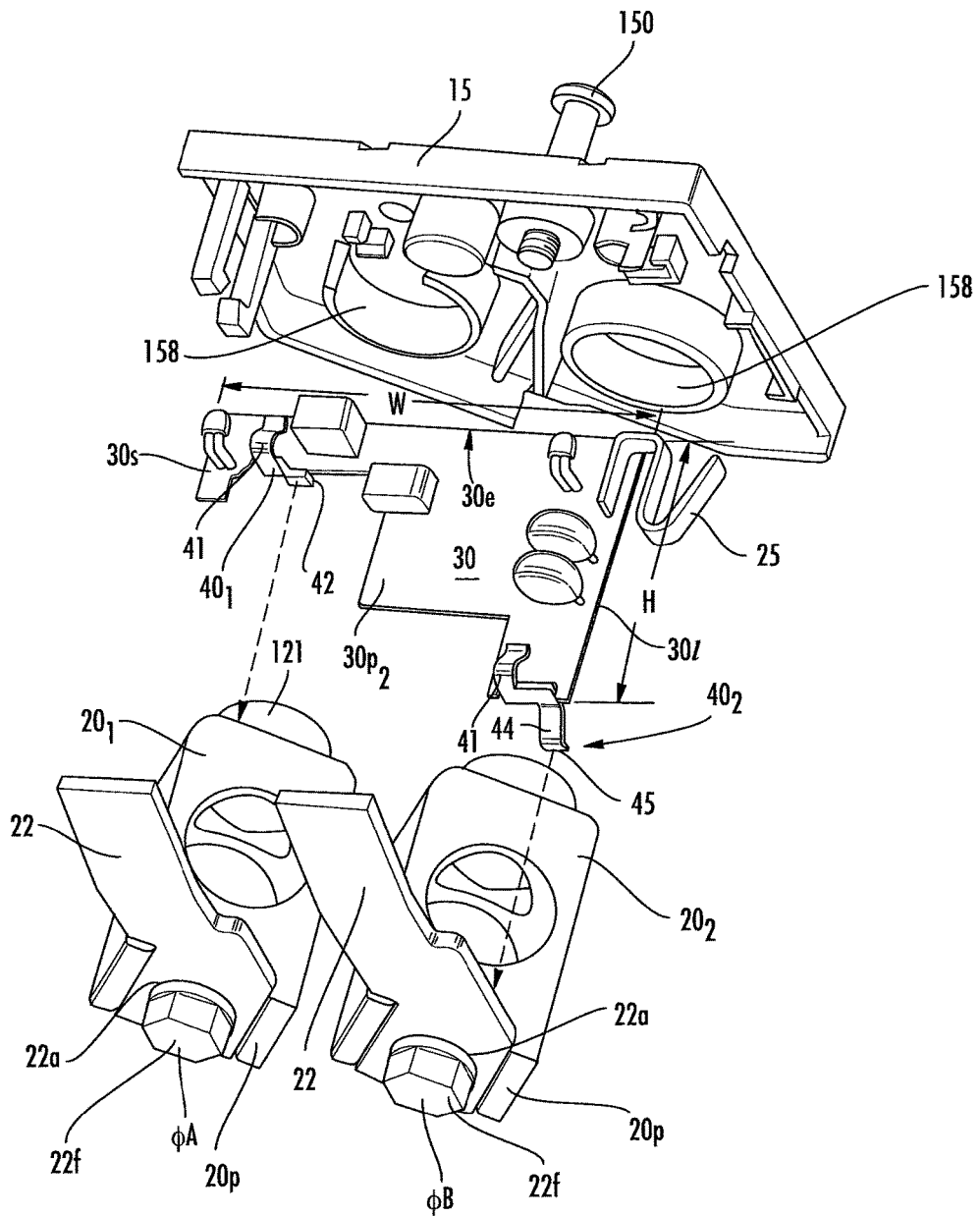
FIG. 7 is a bottom, perspective and partially exploded view of an exemplary lug assembly, shown without a bottom housing, according to embodiments of the present invention.
Figure 8:
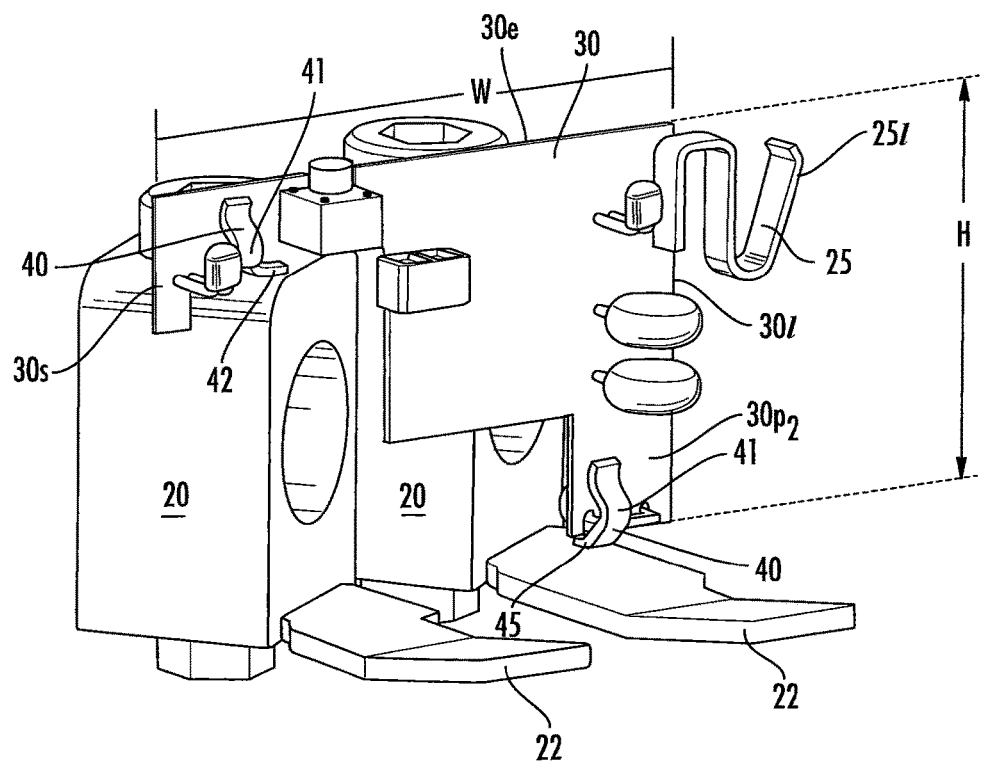
FIG. 8 is an enlarged, partial assembled view of a lug assembly, shown without the bottom housing and cover, according to embodiments of the present invention.

Referring to FIG. 7 and FIG. 8, the printed circuit board 30 can have a width dimension W and a height dimension H and a perimeter with one side being shorter than an opposing side across the width dimension. In some embodiments, the width dimension W can be greater than the height dimension H. In some particular embodiments, the short side 30s can be 20-40% of the height of the long side 30l.

As shown in FIG. 7 and FIG. 8, a first electrical contact connector $40_1$ can reside adjacent the short side 30s with a curvilinear segment 41 of the connector $40_1$ can project outward from the primary surface $30p_2$ of the board at an inner edge of the printed circuit board. The curvilinear segment 41 can merge into a planar segment 42 that can electrically couple and contact a first lug $20_1$.

As also shown in FIG. 7 and FIG. 8, a second electrical contact $40_2$ can extend down a distance from the long side 30l of the printed circuit board 30. The second electrical contact $40_2$ can have a curvilinear segment 41 with a free end that extends a distance away (below) the long side of the board 30l and can include a planar segment 45 that electrically couples to the terminal 22 of the second lug $20_2$. The first and second electrical contact connectors $40_1$, $40_2$, can be metal (electrically conductive) flexible contact clips.

FIG. 7 shows that the lug assembly terminals 22 can include apertures 22a and fasteners 22f and can be directly connected to respective power cables 120 (e.g., phase A power cable and phase B power cable, as shown). The lug assembly terminals 22 can be copper or other suitably conductive material. The terminals 22 can angle outward from the lugs 20, coplanar with an innermost planar surface 20p of the lugs 20, above the fasteners 22f, but can be held in parallel and linearly straight alignment in a vertical orientation in the enclosure with the lugs 20 and cables 120 angled inwardly (FIG. 3A). The orientation of the lugs/cables with respect to the vertical centerline of the enclosure can be in arrange of 0-90 degrees and any value therebetween, such as 0 degrees, about 30 degrees, about 35 degrees, about 45 degrees, about 50 degrees, about 60 degrees, about 75 degrees, about 80 degrees, about 85 degrees and about 90 degrees.

As shown in FIG. 4, the interior compartment of the housing 10i can include a planar wall segment 11 that can have an end slot 12 that holds a corner of the printed circuit board 30. The housing 10h can have laterally spaced apart internal shaped cavities 10c that hold respective electrical components 32, 34, 33.

Figure 9A:
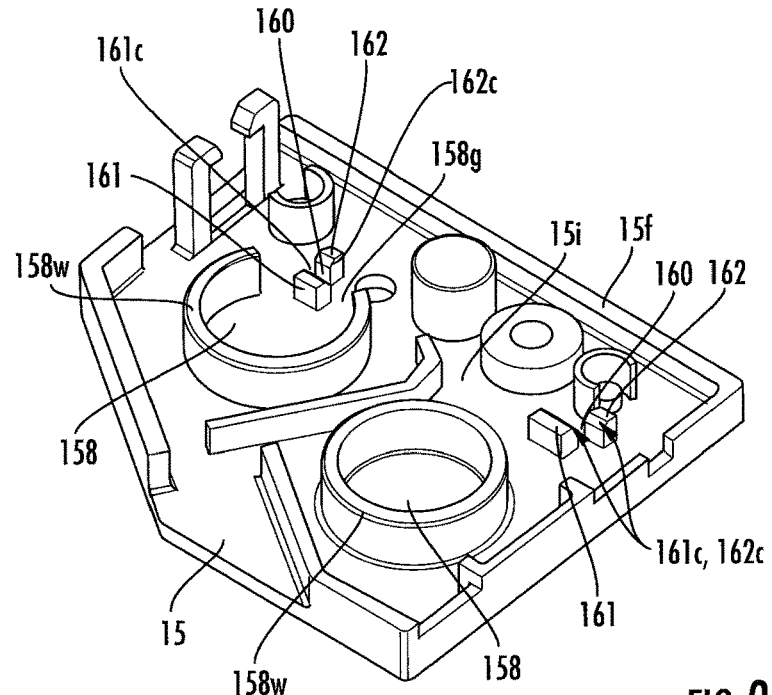
FIG. 9A is an enlarged bottom perspective view of a cover for the lug assembly housing according to embodiments of the present invention.
Figure 9B:
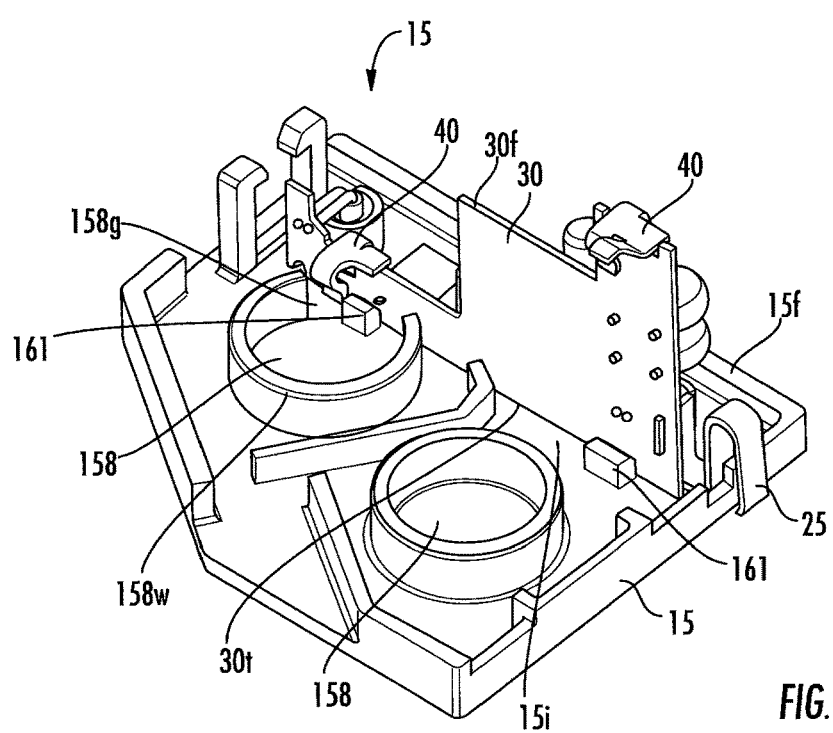
FIG. 9B is an enlarged bottom perspective view of the cover shown in FIG. 9A with an exemplary printed circuit board assembled thereto according to embodiments of the present invention.

FIG. 9A and FIG. 9B illustrate the bottom of the cover 15 showing a plurality of adjacent internal cavities 158 that slidably receive the fastener tops 121t (FIG. 4) and a slot 160, which can be provided by a plurality of cooperating pairs of laterally spaced apart projections 161, 162, that holds an upper or top edge 30t of the printed circuit board 30, for example. The top edge 30t can be a longest side of the perimeter 30p of the printed circuit board 30 and can span 80-95% a lateral extent of the cover 15 as shown in FIG. 9B, for example.

The cavities 158 can be cylindrical cavities with walls 158w having circular or semi-circular perimeters when the fastener tops 121t are circular. As shown, one cavity 158 has a closed circular perimeter wall 158w while the other one has a semi-circular perimeter wall 158w with a gap space 158g between adjacent spaced apart neighboring wall segments. The slot 160 frictionally engages the printed circuit board 30 to hold it orthogonal to the primary body of the cover 15b as the cover fastener 150 is tightened into operative position. The inner surface of the cover 15i engages the top edge 30t of the printed circuit board 30 which, in turn, applies a sufficient downward force to maintain constant pressure between the connectors 25, 40 (i.e., spring clips) on the printed circuit board 30 and conductive members (i.e., lugs 20 and/or terminals 22, FIG. 5) of the lug kit 10.

The printed circuit board 30 can be held in the cover 15 to be parallel or angled with respect to the front edge 15f. The innermost edges (shown as upwardly extending outer edges in the orientation of FIG. 9A) of the projecting members 161, 162 can have lead-in chamfers 161c, 162c to help guide the cover onto the top edge of the printed circuit board as the cover 15 and/or fastener 150 (FIG. 5) is rotated into position and tightened against the bottom housing 10h.

Figure 10A:
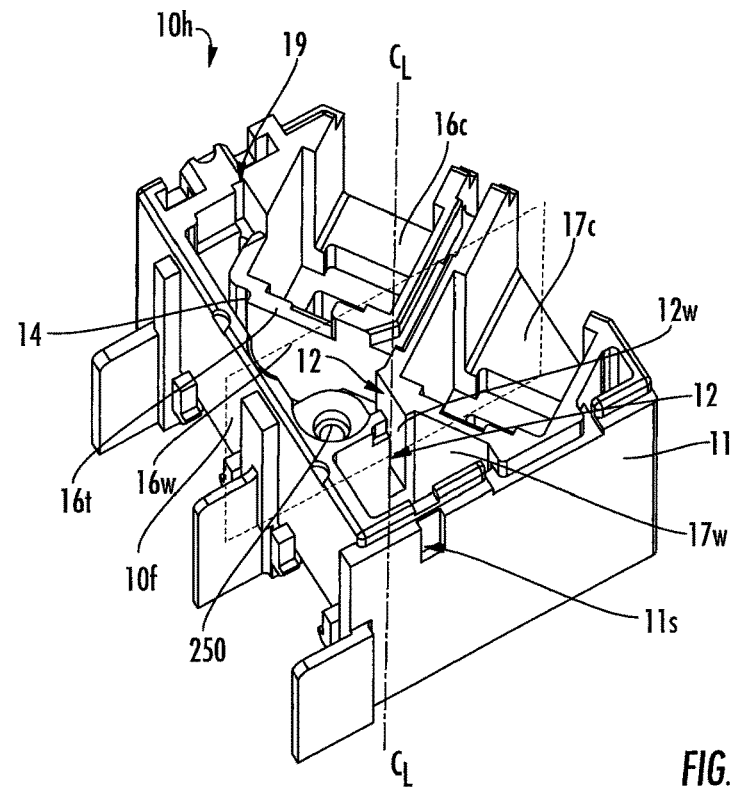
FIG. 10A is a top, side perspective view of a lug assembly housing according to embodiments of the present invention.
Figure 10B:
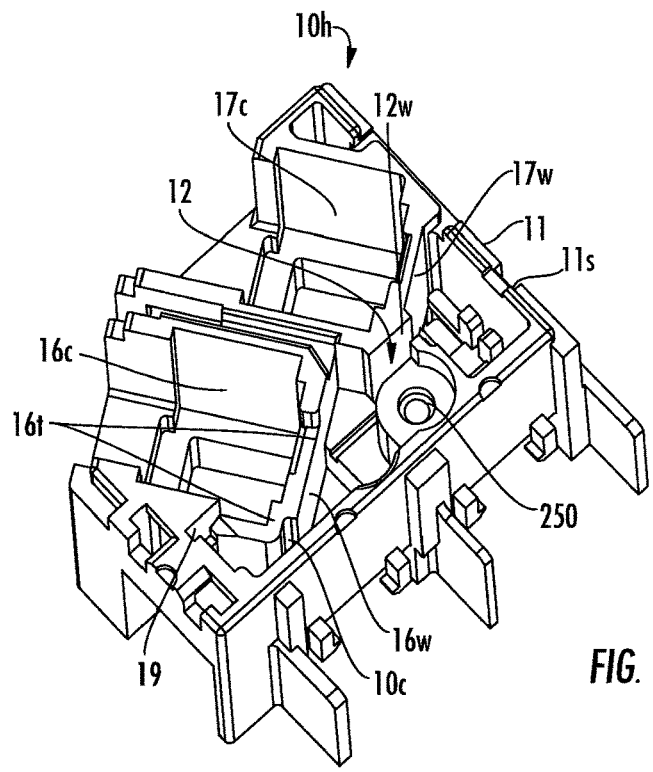
FIG. 10B is a top perspective view of the housing shown in FIG. 10A.
Figure 10C:
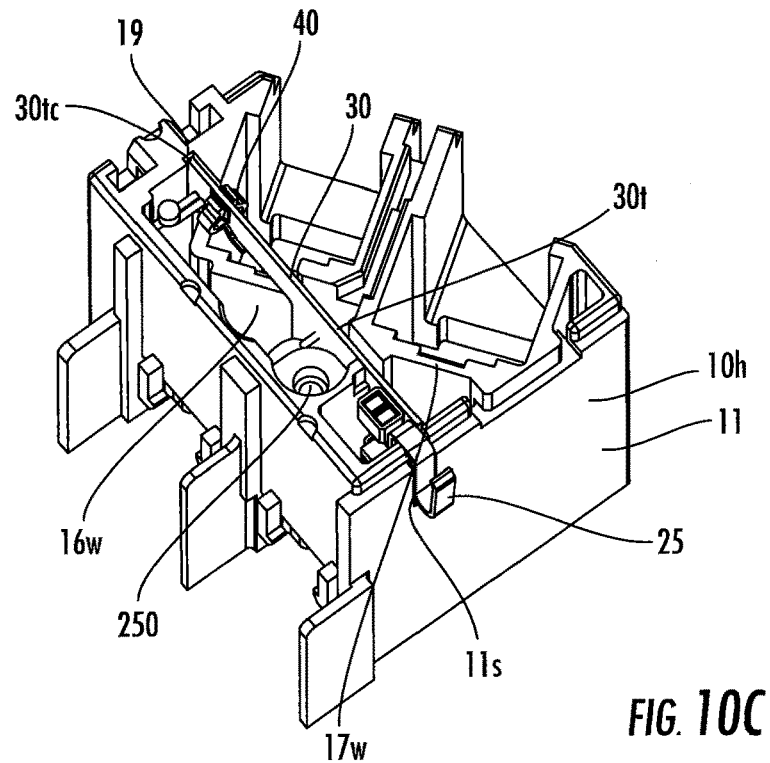
FIG. 10C is a side perspective view of the housing shown in FIG. 10A with a printed circuit board according to embodiments of the present invention.

As shown in FIG. 10A and FIG. 10B, the housing 10h can include an outer sidewall 11 with a slot 11s that slidably receives the ground connector 25 (FIG. 10C). This slot 11s (i.e., planar notch or recess) can extend down from a top edge of the sidewall 11 a partial length of the sidewall, such as a distance between 0.1-2 inches. In other embodiments, it may extend an entire length extent (not shown). The slot 11s can hold a segment of the ground connector 25 to inhibit the ground connector 25 from twisting as it engages the electrically grounded metal 125 of the enclosure 100 (FIG. 1).

As also shown in FIG. 10A-10D, the housing 10h can include a number of internal shaped features that can be moldably formed to be integral with the housing 10h and/or can help locate and/or support the printed circuit board 30. Referring to FIG. 10A, an internal laterally extending slot 12 can reside between a planar internal wall 12w and a cylindrical channel 250. This slot 12 can help locate and/or support the printed circuit board 30 and can be sized to slidably receive a bottom of the printed circuit board as the cover screw 150 (FIG. 5) is tightened into channel 250.

Figure 10D:
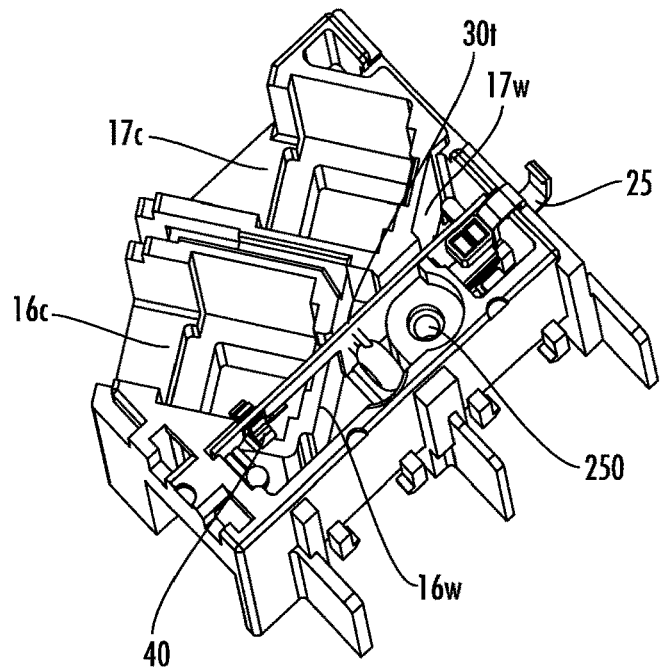
FIG. 10D is a top perspective view of the housing and printed circuit board shown in FIG. 10A.

The housing 10h may also include an internal wall 16w that has a top 16t that is recessed or stepped down a distance relative to the front wall 10f to provide clearance for the printed circuit board 30 and contact connector 40 (FIG. 10C, 10D).

As shown in FIGS. 10C and 10D, the top end 30t of the printed circuit board 30 and the upper contact connector 40 can reside above this clearance wall 16w. The housing 10h can also have an internal corner notch 19 that holds an outer top corner 30tc of the printed circuit board 30.

The housing 10h can include a plurality of inwardly extending and laterally spaced apart walls, shown as first, second and third walls, 16w, 12w and 17w. The first and third walls 16w, 17w can angle in a lateral direction and reside in front of parallel lug cavities 16c, 17c. The medial wall 12w can be between the walls 16w, 17w and can be parallel to the front wall 10f.

Figure 11:
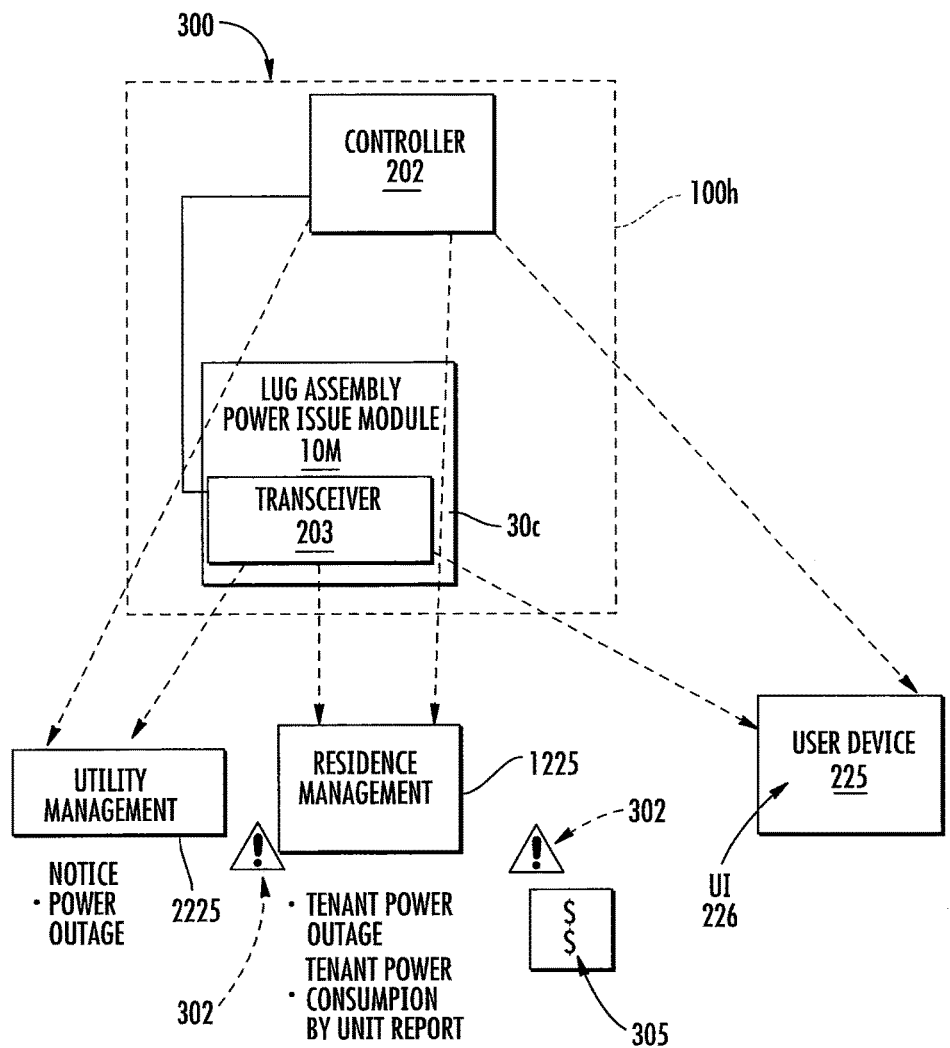
FIG. 11 is a schematic illustration of a control circuit using the lug assembly according to embodiments of the present invention.
Figure 12:
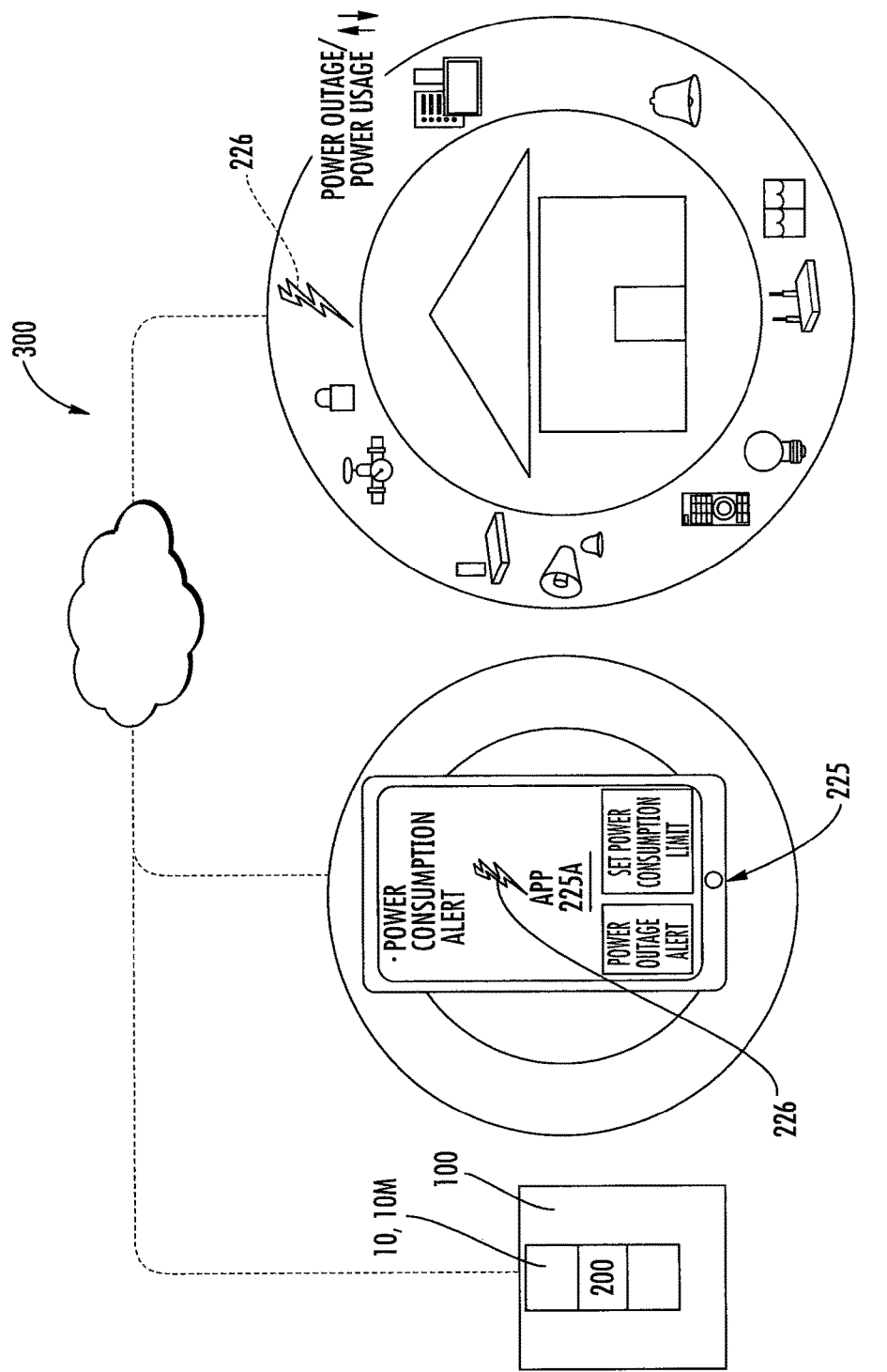
FIG. 12 is a schematic illustration of a control circuit using the lug assembly according to embodiments of the present invention.

FIGS. 11 and 12 illustrate a control circuit 300 which communicates with the lug assembly 10 and can be part of a "whole house" control circuit.

FIG. 11 illustrates that the control circuit 300 can have at least one primary controller 202 that communicates with or is onboard the circuit 30c of the lug assembly 10. The circuit 30c can include a transceiver 203 and a digital signal processor as some of the electronic components on the printed circuit board 30. The lug assembly 10 can include a control circuit module 10M onboard or in communication with the printed circuit board 30 that carries out alerts, monitoring and measurements, for example, according to embodiments of the present invention. The term "module" refers to hardware and software components that allow the functionality using the electrical circuitry 30c of the lug assembly 10. The controller 202 can be remote or local, such as held in or by the enclosure 100h as shown. The controller 202 can communicate with all the lug assemblies 10 in the enclosure.

The module 10M can communicate with the controller 202 of the control circuit 300 and to various users, such as tenants or homeowners 225, residence management services 1225 and utility companies and/or affiliated management services 2225 to send out (tenant or user side) power consumption information such as in a report of unit specific usage 305, power outage notices or alerts 302 and the like. The controller 202 can send out the communication data and/or alert or the lug assembly 10 can directly send out the communication data.

The control circuit 300 and/or the lug assembly module 10M can be a wireless circuit and/or may be hard-wired to one or more lug assemblies 10 in a respective enclosure 100h. The wireless connectivity, where used, can be via WiFI, LTE, BLUETOOTH®, ZIGBEE®, or Z-WAVE and the like or any wireless protocols in existence now or in the future.

The circuit 300 can also be configured to operate with a user device 225 having a User Interface (UI) 226. As shown, the user device 225 can wirelessly communicate with the controller 202 and/or with specific modules. The UI 226 can be a Graphic User Interface (GUI) or keypad UI or other UI that allows a user to adjust, access or select various operational features of the module 10. The user device 225 can be a computer, smartphone, electronic notebook, and the like. The UI 226 can be provided via an APP 225A. The term "APP" refers to a program or piece of software designed to fulfill a particular purpose; an application, especially as downloaded by a user to a mobile device.

As shown in FIG. 12, the lug assembly module 10 can be associated with a power usage control setting and/or power outage alert icon such as a lighting strike graphic shown at the top of the circle of different control inputs. A similar icon/graphic can be provided as an APP 225A for controlling or accessing the module 10. A user can choose to limit power usage at the lug assembly 10 by selecting a desired power usage range using the icon 226 and/or review power consumption or power outage alerts, for example.

Figure 13:
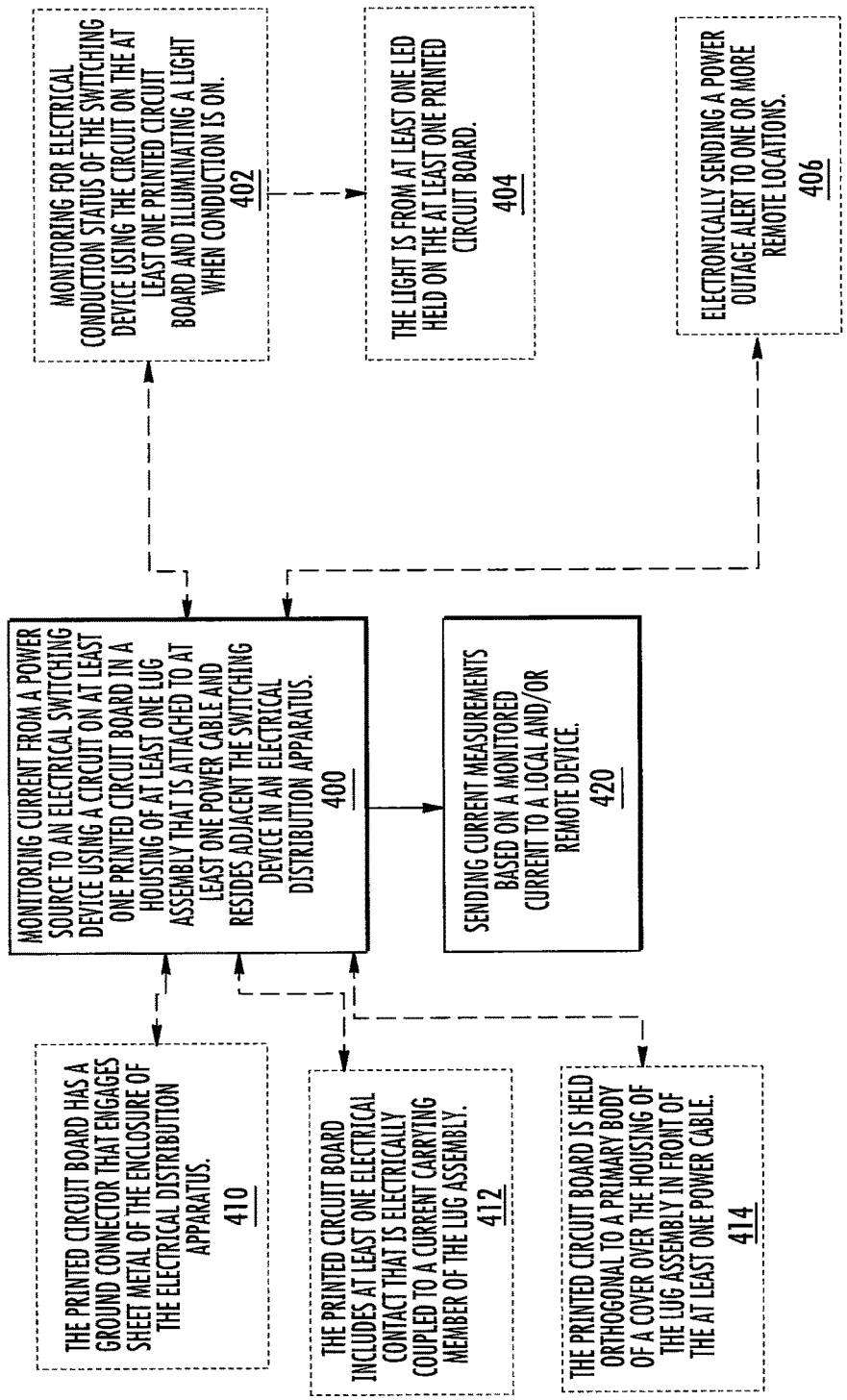
FIG. 13 is a flow chart of actions that can be carried out using electronics of a lug assembly according to embodiments of the present invention.

FIG. 13 is a flow chart of actions that can be carried out using a lug assembly according to embodiments of the present invention. Current from a power source to an electrical switching device can be monitored using a circuit on at least one printed circuit board in a housing of at least one lug assembly that is attached to at least one power cable and resides adjacent the switching device in an electrical distribution apparatus (block 400). Current measurements based on the monitored current can be sent to a local and/or remote device (block 420).

Electrical conduction status of the switching device can be monitored using the circuit on the at least one printed circuit board and illuminating a light when conduction is on (block 402).

The light can be from at least one LED held on the at least one printed circuit board (block 404).

A power outage alert can be electronically sent to one or more remote locations based on the monitored current (block 406).

The printed circuit board can have a ground connector that engages sheet metal of the enclosure of the electrical distribution apparatus (block 410).

The printed circuit board can include at least one electrical contact that is electrically coupled to a current carrying member of the lug assembly (block 412).

The printed circuit board can be held orthogonal to a primary body of a cover over the housing of the lug assembly in front of the at least one power cable (block 414).

Figure 14:
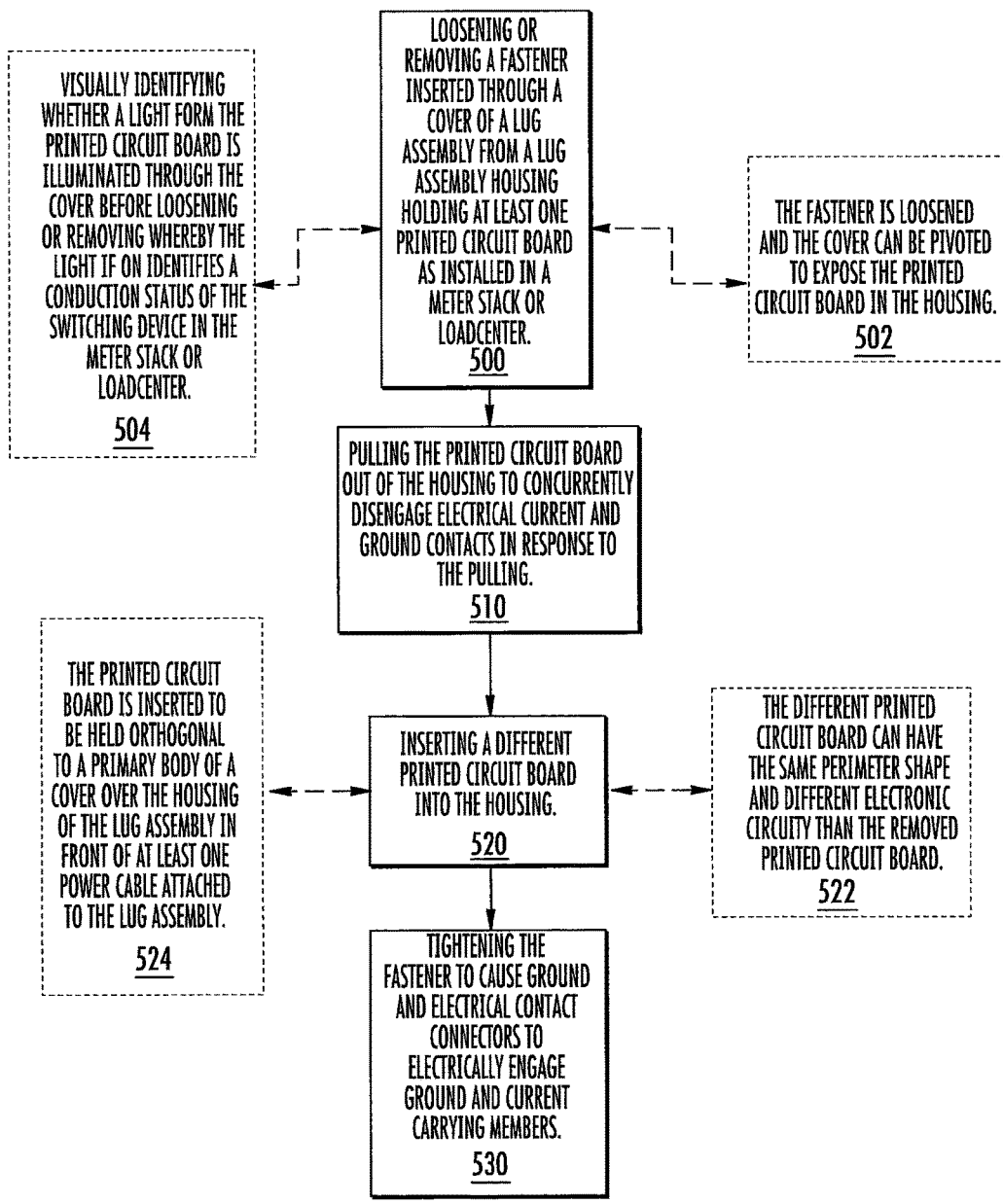
FIG. 14 is a flow chart of actions for installing electronic components into an electrical apparatus according to embodiments of the present invention.

FIG. 14 is a flow chart of actions that can be used to replace, repair or upgrade a lug assembly according to embodiments of the present invention. A fastener inserted through a cover of a lug assembly is loosened or removed from a lug assembly housing holding at least one printed circuit board as installed in an electrical distribution apparatus, optionally a meter stack or loadcenter (block 500). The printed circuit board is pulled out of the housing to concurrently disengage electrical current and ground contacts in response to the pulling (block 510). A different printed circuit board is inserted into the housing (block 520). The fastener is tightened to cause ground and electrical contact connectors to electrically engage ground and current carrying members (block 530).

Instead of totally removing, the fastener can be loosened and the cover can be pivoted to expose the printed circuit board in the housing (block 502).

A user can visually identify whether a light from the printed circuit board is illuminated through the cover before loosening or removing whereby the light if on identifies a conduction status of the switching device in the electrical distribution apparatus, optionally a meter stack or loadcenter (block 504).

The different printed circuit board can have the same perimeter shape and different electronic circuitry than the removed printed circuit board (block 522).

The printed circuit board can be inserted to be held orthogonal to a primary body of a cover over the housing of the lug assembly in front of at least one power cable (below in the orientation shown in FIG. 3A) attached to the lug assembly (block 524).

Where the switching device 200 is or comprises a circuit breaker 200c, the circuit breaker 200c can be a main circuit breaker. The circuit breaker 200c can optionally be an Arc Fault Circuit Interrupter (AFCI) and/or Ground Fault Circuit Interrupter (GFCI) which are among a variety of overcurrent protection devices used for circuit protection and isolation. AFCIs reduce fire hazards in electrical circuits by reducing the effects of high current arcing faults as well as detecting persistent low-current arcing faults. GFCIs reduce the potential of electrical shock. Both branch feeder and combination AFCIs provide conventional thermal and magnetic overcurrent protection. Both can also provide high current or "parallel" arcing fault detection and fire mitigation for installed wiring and connected cords. National Electrical Code (NEC) revisions have increased the requirement for sections of the home that require Arc Fault or Ground Fault protection. Optionally, the circuit breaker can be a Type BR or CH AFCI or GFCI breaker.

It is also noted that the lug assemblies may be useful for other electrical apparatus or devices, including, by way of example, for connecting conductors in Motor Control Centers or buckets thereof, motor starters or feeders, switchgears and the like. See, e.g., U.S. Pat. No. 4,024,441, U.S. Patent Application Publication Serial Number US 2013/0077210, U.S. Pat. Nos. 6,194,983 and 7,186,933, the contents of which are hereby incorporated by reference as if recited in full herein.

The term "circuit" refers to software embodiments or embodiments combining software and hardware aspects, features and/or components, including, for example, at least one processor and software associated therewith embedded therein and/or executable by and/or one or more Application Specific Integrated Circuits (ASICs), for programmatically directing and/or performing certain described actions, operations or method steps.

A circuit can reside in one location or multiple locations, it may be integrated into one component or may be distributed, e.g., it may reside entirely in a workstation or single computer, partially in one station, cabinet, or computer, or totally in a remote location. If the latter, a local computer and/or processor can communicate over a LAN, WAN and/or internet. The circuit and/or a server associated with the circuit can be provided using cloud computing which includes the provision of computational resources on demand via a computer network. The resources can be embodied as various infrastructure services (e.g., compute, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. A cloud computing service (or an aggregation of multiple cloud resources) may be generally referred to as the "Cloud". Cloud storage may include a model of networked computer data storage where data is stored on multiple virtual servers, rather than being hosted on one or more dedicated servers Computer program code for carrying out operations of data processing systems, method steps or actions, modules or circuits (or portions thereof) discussed herein may be written in a high-level programming language, such as Python, Java, AJAX (Asynchronous JavaScript), C, and/or C++, for development convenience. In addition, computer program code for carrying out operations of exemplary embodiments may also be written in other programming languages, such as, but not limited to, interpreted languages. Some modules or routines may be written in assembly language or even micro-code to enhance performance and/or memory usage. However, embodiments are not limited to a particular programming language.

The term "electronically" includes both wireless and wired connections between components.

The present invention is described in part with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A lug assembly for a switching device of an electrical distribution apparatus, comprising:
    a housing having an interior compartment and an outer wall, the outer wall comprising at least one cable channel;
    at least one lug held in the interior compartment of the housing adapted to attach to a power cable, the lug having an open channel aligned with the cable channel in the outer wall of the housing;
    a printed circuit board held in the housing;
    at least one ground connector coupled to the printed circuit board and having a free end that extends off the printed circuit board; and
    at least one contact connector coupled to the printed circuit board, spaced apart from the at least one ground connector and having a free end that extends off the printed circuit board,
    wherein the at least one lug comprises first and second lugs, wherein the printed circuit board has a perimeter having a width dimension and a height dimension, wherein the perimeter comprises opposing first and second sides across the width dimension with the first side being shorter and the second side being longer in the height dimension, wherein the at least one ground connector comprises a curvilinear ground connector that extends laterally outward from an outer facing end portion of the second side, wherein the at least one contact connector comprises a first contact connector and a second contact connector that are curvilinear and have the free end, wherein the first and second contact connectors are spaced apart from the at least one ground connector, wherein the free end of the first contact connector extends outward from the printed circuit board to couple to a terminal of the first lug, and wherein the free end of the second contact connector extends off the printed circuit board to couple to the second lug.

2. The lug assembly of claim 1, wherein the first and second lugs comprise axially extending centerlines aligned with a fastener that extends therein that reside a distance between 1-2 inches from a primary surface of the printed circuit board.

3. The lug assembly of claim 1, wherein the printed circuit board comprises a circuit with one or more inductor, capacitor, resistor, transceiver, digital signal processor, or onboard battery.

4. The lug assembly of claim 1, wherein the printed circuit board comprises a circuit with a transceiver that wirelessly communicates with one or more local or remote devices.

5. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
- a printed circuit board held in the housing;
- at least one ground connector coupled to the printed circuit board;
- at least one contact connector coupled to the printed circuit board, spaced apart from the at least one ground connector; and
- a cover attached to the housing,
- wherein a top edge of the printed circuit board is coupled to an inner surface of the cover, and wherein the printed circuit board is orthogonal to a primary body of the cover.

6. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
- a printed circuit board held in the housing;
- at least one ground connector coupled to the printed circuit board; and
- at least one contact connector coupled to the printed circuit board, spaced apart from the at least one ground connector,
- wherein the lug assembly comprises at least one terminal that extends out of the housing in an outer wall of the housing spaced apart from the outer wall comprising the at least one cable channel, wherein the at least one ground connector comprises a ground connector that extends a distance laterally outside a perimeter of the printed circuit board, and wherein the at least one contact connector extends a distance outside the perimeter of the printed circuit board.

7. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
- a printed circuit board held in the housing;
- at least one ground connector coupled to the printed circuit board; and
- at least one contact connector coupled to the printed circuit board, spaced apart from the at least one ground connector,
- wherein the at least one ground connector is curvilinear and has a free end that can flex inwardly, and wherein the at least one ground connector extends a distance outside the housing.

8. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
- a printed circuit board held in the housing;
- at least one ground connector coupled to the printed circuit board;
- at least one contact connector coupled to the printed circuit board, spaced apart from the at least one ground connector;
- a cover attached to the housing; and
- at least one fastener that is orthogonal to a primary body of the cover that extends into a receiving member in the housing, wherein the at least one lug comprises first and second lugs, wherein the printed circuit board comprises electrical components that reside off a first primary surface of the printed circuit board and that reside in contoured cavities of the housing, wherein the cover comprises cylindrical cavities that receive first and second circular fasteners attached to a top of the first and second lugs, and wherein the cover, when assembled, applies an inwardly extending force against the printed circuit board to thereby provide positive engagement contacts with ground and current carrying members at installation.

9. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
- a printed circuit board held in the housing;
- at least one ground connector coupled to the printed circuit board;
- at least one contact connector coupled to the printed circuit board, spaced apart from the at least one ground connector; and
- a cover attached to the housing,
- wherein the cover comprises a primary body with an inner surface that secures a top edge of the printed circuit board, wherein the printed circuit board is a first printed circuit board with a perimeter shape and comprising a circuit with electronic components, wherein the circuit is adapted to monitor current from a power source delivered from at least one power cable to the switching device, and wherein the lug assembly is configured to serially and interchangeably accept a second printed circuit board with a different circuit and the same perimeter shape to thereby allow the lug assembly to provide changeable and different monitoring and alert functionality.

10. A lug assembly for a switching device of an electrical distribution apparatus, comprising:
- a housing having an interior compartment and an outer wall, the outer wall comprising at least one cable channel;
- at least one lug held in the interior compartment of the housing adapted to attach to a power cable, the lug having an open channel aligned with the cable channel in the outer wall of the housing;
a printed circuit board held in the housing;
at least one ground connector coupled to the printed circuit board; and
at least one contact connector coupled to the printed circuit board, spaced apart from the at least one ground connector,
wherein the printed circuit board comprises a circuit that couples to the at least one contact connector and monitors power usage at the switching device, and transmits signals associated with power usage measurements and/or power outage alarms to remote devices.

11. A lug assembly for a switching device of an electrical distribution apparatus, comprising:
a housing having an interior compartment and an outer wall, the outer wall comprising at least one cable channel;
at least one lug held in the interior compartment of the housing adapted to attach to a power cable, the lug having an open channel aligned with the cable channel in the outer wall of the housing;
a printed circuit board held in the housing;
at least one ground connector coupled to the printed circuit board;
at least one contact connector coupled to the printed circuit board, spaced apart from the at least one ground connector; and
a cover attached to the housing,
wherein the printed circuit board comprises a conduction monitoring circuit with at least one light emitting diode (LED) that is visually accessible through the cover, and wherein the LED illuminates when there is conduction to the switching device.

12. A lug assembly for a switching device of an electrical distribution apparatus, comprising:
a housing having an interior compartment and an outer wall, the outer wall comprising at least one cable channel;
at least one lug held in the interior compartment of the housing adapted to attach to a power cable, the lug having an open channel aligned with the cable channel in the outer wall of the housing;
a printed circuit board held in the housing;
at least one ground connector coupled to the printed circuit board; and
at least one contact connector coupled to the printed circuit board, spaced apart from the at least one ground connector,
wherein the printed circuit board comprises a circuit that is coupled to the at least one lug through the at least one contact connector to monitor tenant side power usage in a meter stack.

13. An electrical distribution apparatus comprising:
an enclosure;
a lug assembly in the enclosure, the lug assembly comprising:
a housing having an interior compartment and an outer wall, the outer wall comprising at least one cable channel;
at least one lug held in the interior compartment of the housing;
a printed circuit board held in the housing;
at least one ground connector attached to the printed circuit board and electrically coupled to the enclosure;
at least one contact connector attached to the printed circuit board and coupled to the at least one lug; and
at least one terminal coupled to the at least one lug and extending out of the housing;
at least one power cable attached to a corresponding one lug of the at least one lug in the housing of the lug assembly; and
a switching device coupled to the at least one terminal, wherein the at least one terminal of the lug assembly provides an electrical path for current from the power cable to the switching device.

14. The apparatus of claim 13, further comprising first and second lugs as the at least one lug, first and second contact connectors as the at least one contact connector, and first and second power cables as the at least one power cable, wherein the first power cable couples to the first lug and the second power cable couples to the second lug, and wherein the first contact connector couples to the first lug and the second contact connector couples to the second lug.

15. The apparatus of claim 14, wherein the at least one terminal of the lug assembly comprises first and second terminals, wherein the switching device comprises a circuit breaker and first and second circuit breaker lugs each having an open through channel that couple to the first and second lugs of the lug assembly to provide electrical current pathways, and wherein the first and second lugs of the lug assembly are spaced apart with axially extending centerlines aligned with a respective fastener that extends therein, and wherein the axially extending centerlines of the first and second lugs reside a distance in a range of 1-2 inches from a primary surface of the printed circuit board.

16. The apparatus of claim 13, further comprising a cover attached to the housing, wherein the printed circuit board is orthogonal to a primary body of the cover.

17. The apparatus of claim 13, wherein the at least one ground connector comprises a ground connector that is curvilinear and extends a distance laterally outside a perimeter of the printed circuit board and outside the housing, and wherein the at least one contact connector is curvilinear and extends a distance outside the perimeter of the printed circuit board.

18. The apparatus of claim 13, wherein the printed circuit board is a first printed circuit board with a perimeter shape and comprising a circuit with electronic components, wherein the circuit is adapted to monitor current from a power source delivered from at least one power cable to the switching device, and wherein the lug assembly is configured to serially and interchangeably accept a second printed circuit board with a different circuit and the same perimeter shape to thereby allow the lug assembly to provide changeable and different monitoring and alert functionality.

19. The apparatus of claim 13, wherein the printed circuit board comprises a circuit with one or more of an inductor, capacitor, resistor, transceiver, digital signal processor, or battery.

20. The apparatus of claim 13, wherein the printed circuit board comprises a circuit that couples to the at least one contact connector and monitors power usage at the switching device, and wherein the circuit comprises a wireless transceiver that sends power usage measurements and/or power outage alarms to remote devices.

21. The apparatus of claim 13, further comprising a cover attached to the housing, wherein the printed circuit board comprises a conduction monitoring circuit with at least one light emitting diode (LED) that is visually accessible through the cover, and wherein the LED illuminates when there is conduction to the switching device.

22. The apparatus of claim 13, wherein the printed circuit board has a perimeter having a width dimension and a height dimension, wherein the perimeter comprises opposing sides across the width dimension with one side being shorter and the other side being longer than the other in the height dimension, wherein the at least one ground connector comprises a curvilinear ground connector that extends laterally outward from the printed circuit board, wherein the at least one contact connector comprises a first contact connector and a second contact connector that are curvilinear and are spaced apart from the at least one ground connector, wherein the at least one lug comprises first and second lugs, and wherein the first contact connector extends outward from the printed circuit board to couple to a first terminal of the at least one terminal that is coupled to the first lug, and wherein the second contact connector extends out from the printed circuit board to couple to the second lug.

\* \* \* \* \*